US012648249B2

(12) United States Patent
Ko et al.

(10) Patent No.: US 12,648,249 B2
(45) Date of Patent: Jun. 2, 2026

(54) IMAGE SENSOR

(71) Applicant: Samsung Electronics Co., Ltd.,
Suwon-si (KR)

(72) Inventors: Seonghoon Ko, Suwon-si (KR); Jae Ho Kim, Suwon-si (KR); Uihui Kwon, Suwon-si (KR); Wook Lee, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 609 days.

(21) Appl. No.: 18/067,393

(22) Filed: Dec. 16, 2022

(65) Prior Publication Data

US 2023/0352509 A1 Nov. 2, 2023

(30) Foreign Application Priority Data

May 2, 2022 (KR) ......................... 10-2022-0054294

(51) Int. Cl.
H10F 39/18 (2025.01)
H10F 39/00 (2025.01)
H10F 39/12 (2025.01)
(52) U.S. Cl.
CPC ......... H10F 39/807 (2025.01); H10F 39/011 (2025.01); H10F 39/182 (2025.01); H10F 39/199 (2025.01); H10F 39/8053 (2025.01); H10F 39/8063 (2025.01); H10F 39/811 (2025.01)
(58) Field of Classification Search
CPC .............................. H10F 39/199; H10F 39/182
See application file for complete search history.

(56) References Cited

U.S. PATENT DOCUMENTS

| | | | | | |
|---|---|---|---|---|---|
| 7,859,027 | B2 * | 12/2010 | Uya | ...................... | H10F 39/803 |
| | | | | | 257/E27.161 |
| 8,278,614 | B2 * | 10/2012 | Han | ...................... | H10F 39/026 |
| | | | | | 250/214 R |
| 9,609,250 | B2 * | 3/2017 | Lee | ...................... | H10F 39/802 |
| 10,103,190 | B2 | 10/2018 | Korobov et al. | | |
| 10,998,359 | B2 | 5/2021 | Lee et al. | | |
| 11,183,526 | B2 | 11/2021 | Ro et al. | | |

(Continued)

FOREIGN PATENT DOCUMENTS

| | | | |
|---|---|---|---|
| KR | 10-0657142 | B1 | 12/2006 |
| KR | 10-2007-0064151 | A | 6/2007 |

(Continued)

*Primary Examiner* — Mounir S Amer
*Assistant Examiner* — Alexander Belousov
(74) *Attorney, Agent, or Firm* — Fish & Richardson P.C.

(57) ABSTRACT

An image sensor includes a substrate including first and second pixel regions adjacent to each other, the substrate including first and second surfaces opposite to each other, a pixel isolation pattern in the substrate to define the first and second pixel regions, a transfer gate on the first surface of the substrate of the first pixel region, a floating diffusion region adjacent to a side of the transfer gate, a first ground dopant region adjacent to the first surface of the substrate in the first pixel region, and a second ground dopant region adjacent to the first surface of the substrate in the second pixel region. A bottom surface of the first ground dopant region is located at a lower level than a bottom surface of the floating diffusion region.

19 Claims, 21 Drawing Sheets

(56)     References Cited

U.S. PATENT DOCUMENTS

| | | | | |
|---|---|---|---|---|
| 11,335,716 B2 * | 5/2022 | Huang | | H10F 39/813 |
| 11,348,960 B2 * | 5/2022 | Ha | | H10F 39/811 |
| 11,502,117 B2 * | 11/2022 | Ha | | H10F 39/199 |
| 11,923,385 B2 * | 3/2024 | Fukui | | H10F 39/807 |
| 12,136,643 B2 * | 11/2024 | Lim | | H10F 39/8063 |
| 12,166,049 B2 * | 12/2024 | Jin | | H10F 39/8053 |
| 12,317,612 B2 * | 5/2025 | Fujii | | H10F 39/8037 |
| 12,349,478 B2 * | 7/2025 | Hiramatsu | | H10D 84/038 |
| 2006/0273354 A1 | 12/2006 | Choi et al. | | |
| 2018/0190694 A1 * | 7/2018 | Ihara | | H10F 39/802 |
| 2020/0279876 A1 * | 9/2020 | Lee | | H10F 39/199 |
| 2020/0381464 A1 | 12/2020 | Hong et al. | | |
| 2021/0111202 A1 * | 4/2021 | Ha | | H10F 39/8037 |
| 2021/0143191 A1 * | 5/2021 | Ha | | H10F 39/199 |
| 2021/0335862 A1 | 10/2021 | Lee et al. | | |
| 2022/0262829 A1 * | 8/2022 | Ha | | H10F 39/014 |
| 2022/0367245 A1 * | 11/2022 | Mun | | H10F 39/807 |
| 2023/0352509 A1 * | 11/2023 | Ko | | H10F 39/182 |
| 2024/0321926 A1 * | 9/2024 | Fujita | | H10F 39/807 |
| 2024/0387585 A1 * | 11/2024 | Kwon | | H10F 39/811 |
| 2024/0387597 A1 * | 11/2024 | Lee | | H04N 25/63 |
| 2025/0133841 A1 * | 4/2025 | Fujita | | H10F 39/807 |

FOREIGN PATENT DOCUMENTS

| | | |
|---|---|---|
| KR | 10-2018-0024072 A | 3/2018 |
| KR | 10-2018-0077710 A | 7/2018 |
| KR | 10-2020-0084719 A | 7/2020 |
| KR | 10-2021-0044364 A | 4/2021 |

* cited by examiner

IMAGE SENSOR

CROSS-REFERENCE TO RELATED APPLICATION

This U.S. non-provisional patent application claims priority under 35 U.S.C. § 119 to Korean Patent Application No. 10-2022-0054294, filed on May 2, 2022, in the Korean Intellectual Property Office, the entire contents of which are hereby incorporated by reference.

BACKGROUND

The present inventive concepts relate to image sensors, and more particularly, to CMOS image sensors.

An image sensor may be a device for converting an optical image into electrical signals. Image sensors may be categorized as any one of charge coupled device (CCD) image sensors and complementary metal-oxide-semiconductor (CMOS) image sensors. 'CIS' may be short for the CMOS image sensor. The CIS may include a plurality of unit pixel regions arranged two-dimensionally. Each of the unit pixel regions may include a photodiode. The photodiode may convert incident light into an electrical signal.

SUMMARY

Some example embodiments of the inventive concepts may provide an image sensor with improved electrical characteristics.

In some example embodiments, an image sensor may include a substrate including a first pixel region and a second pixel region which are adjacent to each other, the substrate including a first surface and a second surface which are opposite to each other, a pixel isolation pattern in the substrate to define the first and second pixel regions, a transfer gate on the first surface of the substrate of the first pixel region, a floating diffusion region adjacent to a side of the transfer gate, a first ground dopant region adjacent to the first surface of the substrate in the first pixel region, and a second ground dopant region adjacent to the first surface of the substrate in the second pixel region. A bottom surface of the first ground dopant region may be located at a lower level than a bottom surface of the floating diffusion region.

In some example embodiments, an image sensor may include a substrate including a plurality of unit pixel regions and having a first surface and a second surface which are opposite to each other, the plurality of unit pixel regions including separate, respective photoelectric conversion regions in the substrate, a pixel isolation pattern penetrating the substrate to define the plurality of unit pixel regions, wherein the substrate includes one or more inner surfaces that at least partially define a trench exposing the pixel isolation pattern, a transfer gate on the first surface of the substrate, a floating diffusion region adjacent to a side of the transfer gate, the floating diffusion region adjacent to the first surface of the substrate, a ground dopant region adjacent to the trench, a connection pattern in the trench, the connection pattern being in contact with the ground dopant region, a contact connected to the floating diffusion region, and a ground contact connected to the ground dopant region. A bottom surface of the ground contact may be located at a lower level than a bottom surface of the contact.

In some example embodiments, an image sensor may include a substrate having a first surface and a second surface which are opposite to each other, the substrate including a pixel array region, an optical black region and a pad region, and the pixel array region including a first pixel region, a second pixel region, a third pixel region and a fourth pixel region wherein the first to fourth pixel regions have separate, respective photoelectric conversion regions; a pixel isolation pattern in the substrate to define the first to fourth pixel regions, the pixel isolation pattern comprising a first isolation pattern and a second isolation pattern that is between the first isolation pattern and the substrate, wherein the substrate includes one or more inner surfaces that at least partially define a trench exposing the pixel isolation pattern, the trench vertically overlapping with a portion of each of the first to fourth pixel regions; a barrier dopant region on a sidewall of the pixel isolation pattern; a device isolation pattern which is in each of the first to fourth pixel regions and is adjacent to the first surface of the substrate; a transfer gate and a gate electrode which are on each of the first to fourth pixel regions and are on the first surface of the substrate; a floating diffusion region adjacent to a side of the transfer gate; source/drain regions at opposite sides of the gate electrode; a first ground dopant region, a second ground dopant region, a third ground dopant region and a fourth ground dopant region which are adjacent to the first surface of the substrate the first to fourth ground dopant regions in separate, respective pixel regions of the first to fourth pixel regions; an insulating layer covering the gate electrode and the transfer gate; an interconnection line in the insulating layer; a contact penetrating the insulating layer and electrically connected to the transfer gate, the gate electrode or the floating diffusion region; a ground contact penetrating the insulating layer and electrically connected to at least one of the first to fourth ground dopant regions; color filters on the second surface of the substrate; and a micro lens portion on the color filters. Each of the first to fourth ground dopant regions may be in contact with a bottom surface and a sidewall of the trench.

BRIEF DESCRIPTION OF THE DRAWINGS

FIG. 3 is a cross-sectional view taken along a line A-A' of FIG. 2.

FIG. 6 is an enlarged cross-sectional view of a region 'N' of FIG. 5A.

FIGS. 9A, 9B, 9C, 9D, 9E, 9F, and 9G are cross-sectional views taken along the line A-A' of FIG. 4 to illustrate a method of manufacturing an image sensor according to some example embodiments of the inventive concepts.

FIG. 14 is an enlarged cross-sectional view of a region 'N' of FIG. 13.

DETAILED DESCRIPTION

Figure 1:
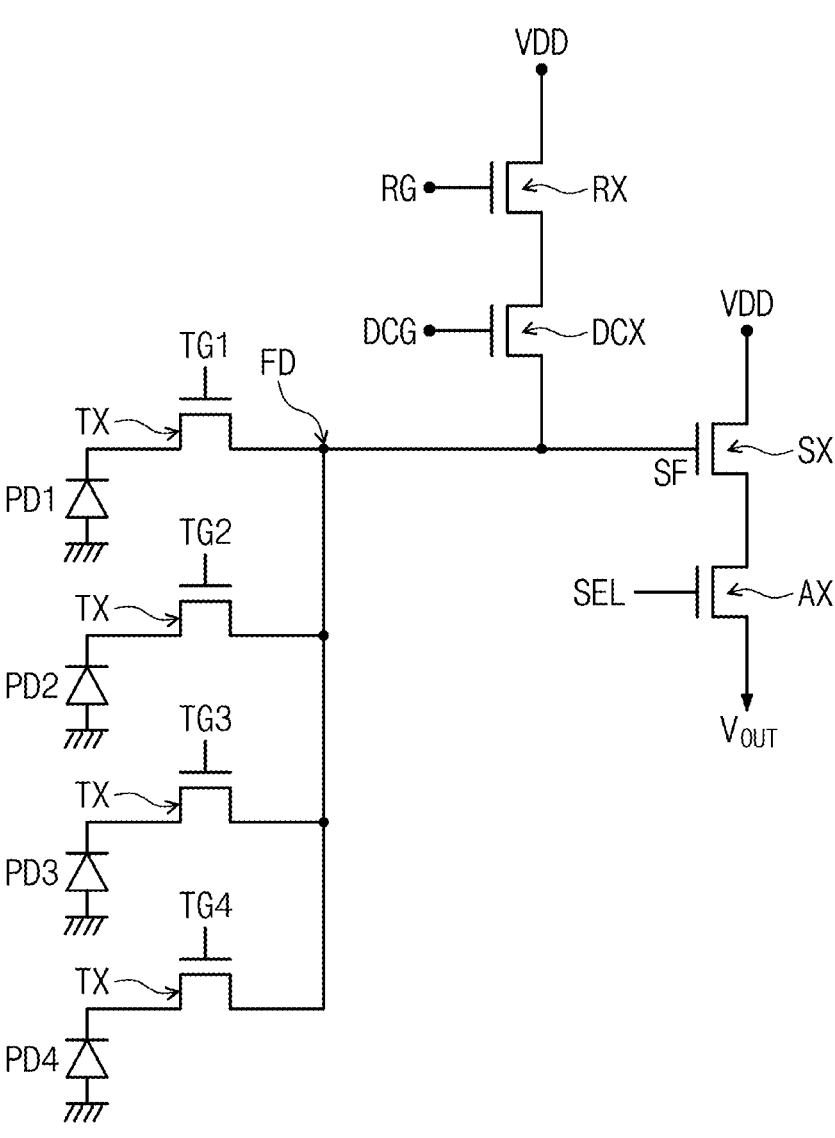
FIG. 1 is a circuit diagram illustrating an image sensor according to some example embodiments of the inventive concepts.

Hereinafter, to describe the inventive concepts in more detail, some example embodiments according to the inventive concepts will be described in more detail with reference to the accompanying drawings. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal"

as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 is a circuit diagram illustrating an image sensor according to some example embodiments of the inventive concepts.

Referring to FIG. 1, unit pixel regions of an image sensor may include photodiodes PD1, PD2, PD3 and PD4, transfer transistors TX, a source follower transistor SX, a reset transistor RX, a dual conversion transistor DCX, and a selection transistor AX. The transfer transistors TX, the source follower transistor SX, the reset transistor RX, the dual conversion transistor DCX and the selection transistor AX may include transfer gates TG1 to TG4, a source follower gate SF, a reset gate RG, a dual conversion gate DCG and a selection gate SEL, respectively.

Each of the photodiodes PD1, PD2, PD3 and PD4 may be a photodiode including an n-type dopant region and a p-type dopant region. A floating diffusion region FD (which in some example embodiments may be referred to as a floating diffusion node) may function as a drain of the transfer transistor TX. The floating diffusion region FD may also function as a source of the dual conversion transistor DCX. The floating diffusion region FD may be electrically connected to the source follower gate SF of the source follower transistor SX. The source follower transistor SX may be connected to the selection transistor AX.

Hereinafter, an operation of the image sensor will be described with reference to FIG. 1. First, in a state in which light is blocked, a power voltage VDD may be applied to a drain of the reset transistor RX and a drain of the source follower transistor SX, and the reset transistor RX and the dual conversion transistor DCX may be turned-on to discharge charges remaining in the floating diffusion region FD. Thereafter, the reset transistor RX may be turned-off, and external light may be incident into the photodiodes PD1, PD2, PD3 and PD4 to generate electron-hole pairs in the photodiodes PD1, PD2, PD3 and PD4. Holes may move into and then be accumulated in the p-type dopant region of each of the photodiodes PD1, PD2, PD3 and PD4, and electrons may move into and then be accumulated in the n-type dopant region thereof. When one of the transfer transistors TX is turned-on, charges such as the electrons or the holes may be transferred into and accumulated in the floating diffusion region FD. A source potential of the source follower transistor SX may be changed in proportion to the amount of the accumulated charges. At this time, when the selection transistor AX is turned-on, a signal by the charges may be read through a column line.

Interconnection lines may be electrically connected to at least one of the transfer gates TG1 to TG4, the source follower gate SF, the reset gate RG, the dual conversion gate DCG, or the selection gate SEL. At least one of the interconnection lines may be configured to apply the power voltage VDD to the drain of the reset transistor RX or the drain of the source follower transistor SX. The interconnection lines may include the column line connected to the selection transistor AX. The interconnection lines may be interconnection lines to be described later. The voltage output $V_{OUT}$ may serve as an output of the image sensor via which signals may be transmitted from the image sensor.

The photodiodes PD1, PD2, PD3 and PD4 are connected to a single floating diffusion region FD in FIG. 1, but embodiments of the inventive concepts are not limited thereto. In some example embodiments, a single unit pixel region may include one of the photodiodes PD1, PD2, PD3 and PD4, a floating diffusion region FD, and one of the transfer transistors TX. In addition, for example, a single unit pixel region may include at least one of the reset transistor RX, the source follower transistor SX, the dual conversion transistor DCX, or the selection transistor AX. In some example embodiments, at least one of the reset transistor RX, the source follower transistor SX, the dual conversion transistor DCX or the selection transistor AX may be shared by adjacent unit pixel regions. Thus, an integration density of the image sensor may be improved.

Figure 2:
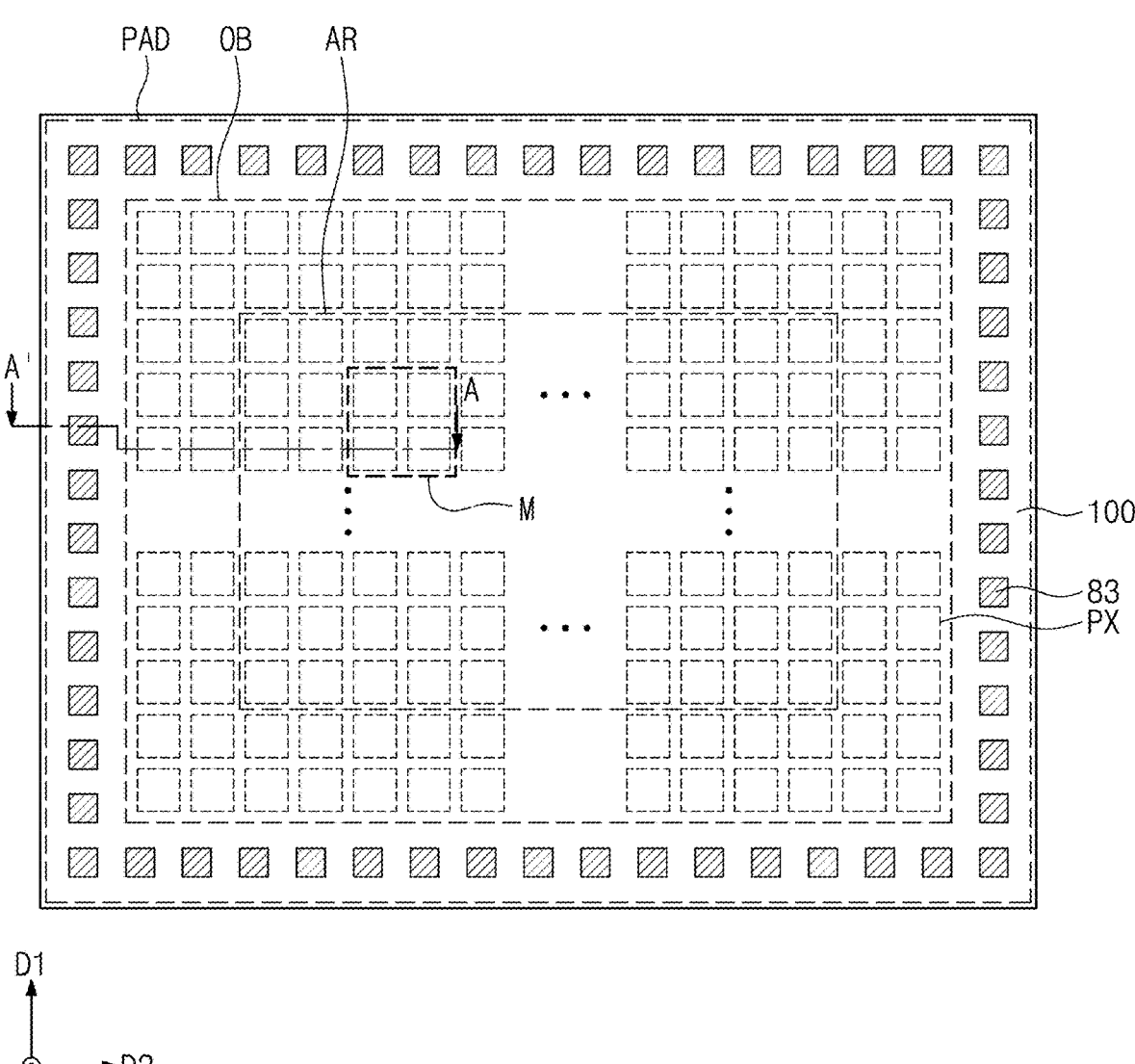
FIG. 2 is a plan view illustrating an image sensor according to some example embodiments of the inventive concepts.
Figure 3:
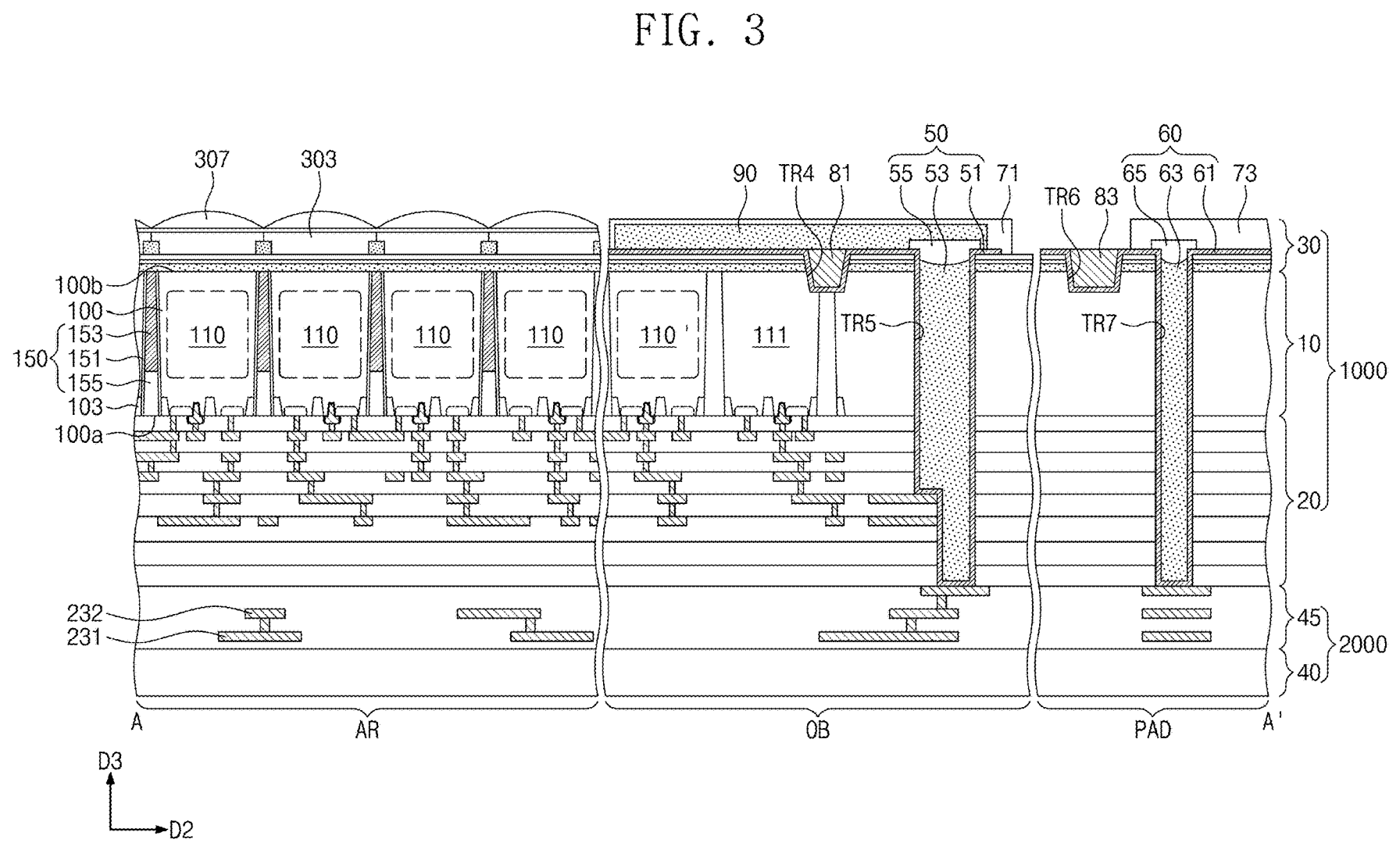

FIG. 2 is a plan view illustrating an image sensor according to some example embodiments of the inventive concepts. FIG. 3 is a cross-sectional view taken along a line A-A' of FIG. 2.

Referring to FIGS. 2 and 3, an image sensor may include a sensor chip 1000 and a logic chip 2000. The sensor chip 1000 may include a photoelectric conversion layer 10, a first interconnection layer 20, and a light transmitting layer 30. The photoelectric conversion layer 10 may include a first substrate 100, a pixel isolation pattern 150, a device isolation pattern 103, and photoelectric conversion regions 110 provided in the first substrate 100. Light incident from the outside may be converted into electrical signals in the photoelectric conversion regions 110.

The first substrate 100 may include a pixel array region AR, an optical black region OB, and a pad region PAD when viewed in a plan view. The pixel array region AR may be disposed in a central portion of the first substrate 100 when viewed in a plan view. The pixel array region AR may include a plurality of unit pixel regions PX. The unit pixel regions PX may output photoelectric signals from incident light. The unit pixel regions PX may constitute columns and rows and may be two-dimensionally arranged. The columns may be parallel to a first direction D1. The rows may be parallel to a second direction D2. In the present specification, the first direction D1 may be parallel to a first surface 100a of the first substrate 100 and/or may be parallel to the second surface 100b of the first substrate 100. The second direction D2 may be parallel to the first surface 100a of the first substrate 100 and may intersect the first direction D1. The second direction D2 may be parallel to the second surface 100b of the first substrate 100 and may intersect the first direction D1. A third direction D3 may be (e.g., may extend) perpendicular or substantially perpendicular to the first surface 100a of the first substrate 100 and/or may be perpendicular or substantially perpendicular to the second surface 100b of the first substrate 100. A fourth direction D4 may be a direction not parallel to both (e.g., not parallel to either of) the first direction D1 and the second direction D2.

The pad region PAD may be provided in an edge portion of the first substrate 100 and may surround the pixel array region AR when viewed in a plan view. Second pad terminals 83 may be provided on the pad region PAD. The second pad terminals 83 may be used to output electrical signals generated from the unit pixel regions PX to the outside. In addition, external electrical signals or voltage may be transferred to the unit pixel regions PX through the second pad terminals 83. Since the pad region PAD is disposed in the edge portion of the first substrate 100, the second pad terminals 83 may be easily connected to an external device.

The optical black region OB may be disposed between the pixel array region AR and the pad region PAD of the first substrate 100. The optical black region OB may surround the pixel array region AR when viewed in a plan view. The optical black region OB may include a plurality of dummy regions 111. A signal generated from the dummy region 111 may be used as data for removing a process noise. Hereinafter, the pixel array region AR of the image sensor will be described in more detail with reference to FIGS. 4, 5A, 5B and 6.

Figure 4:
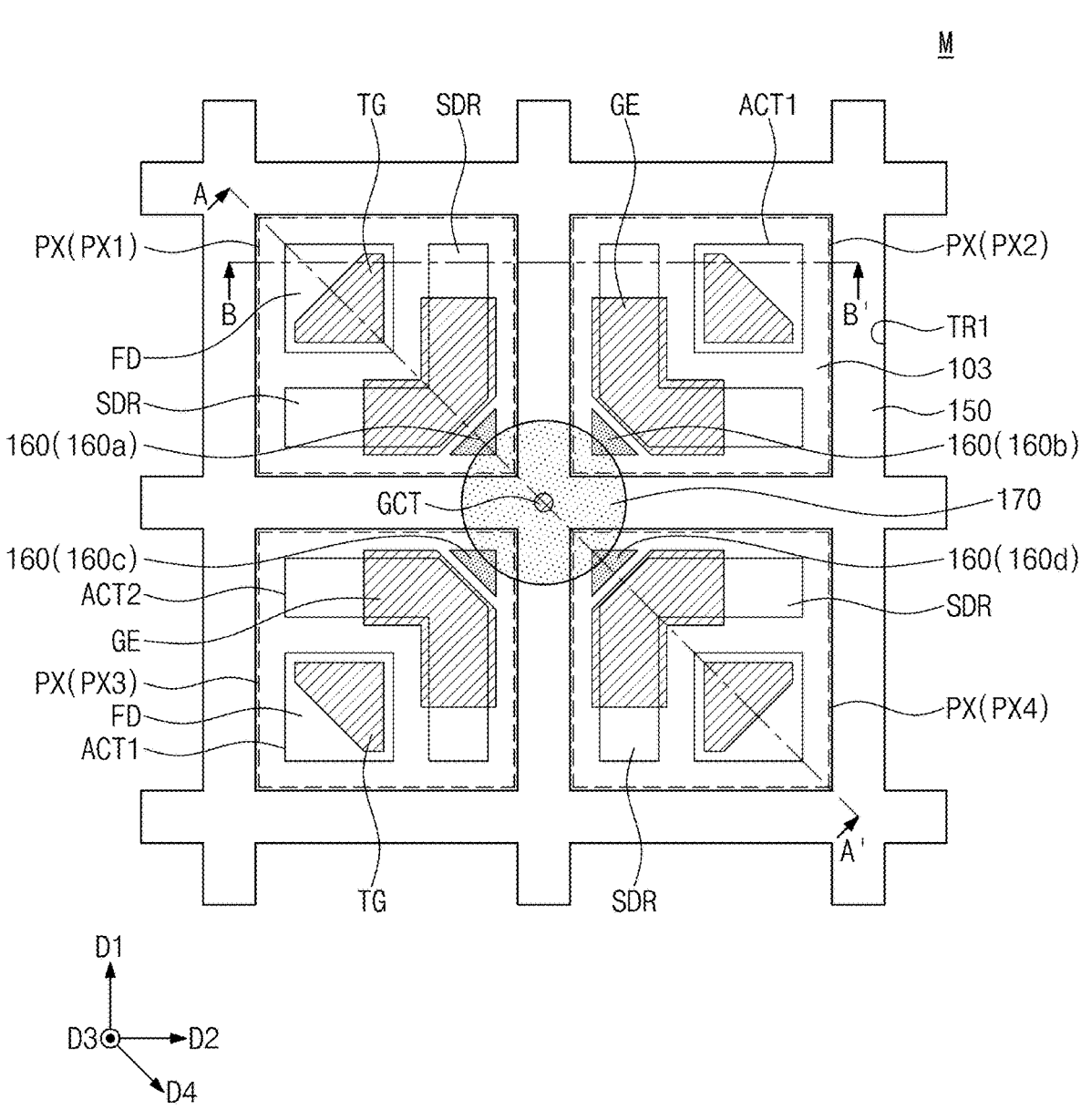
FIG. 4 is an enlarged plan view of a region 'M' of FIG. 2.
Figure 5A:
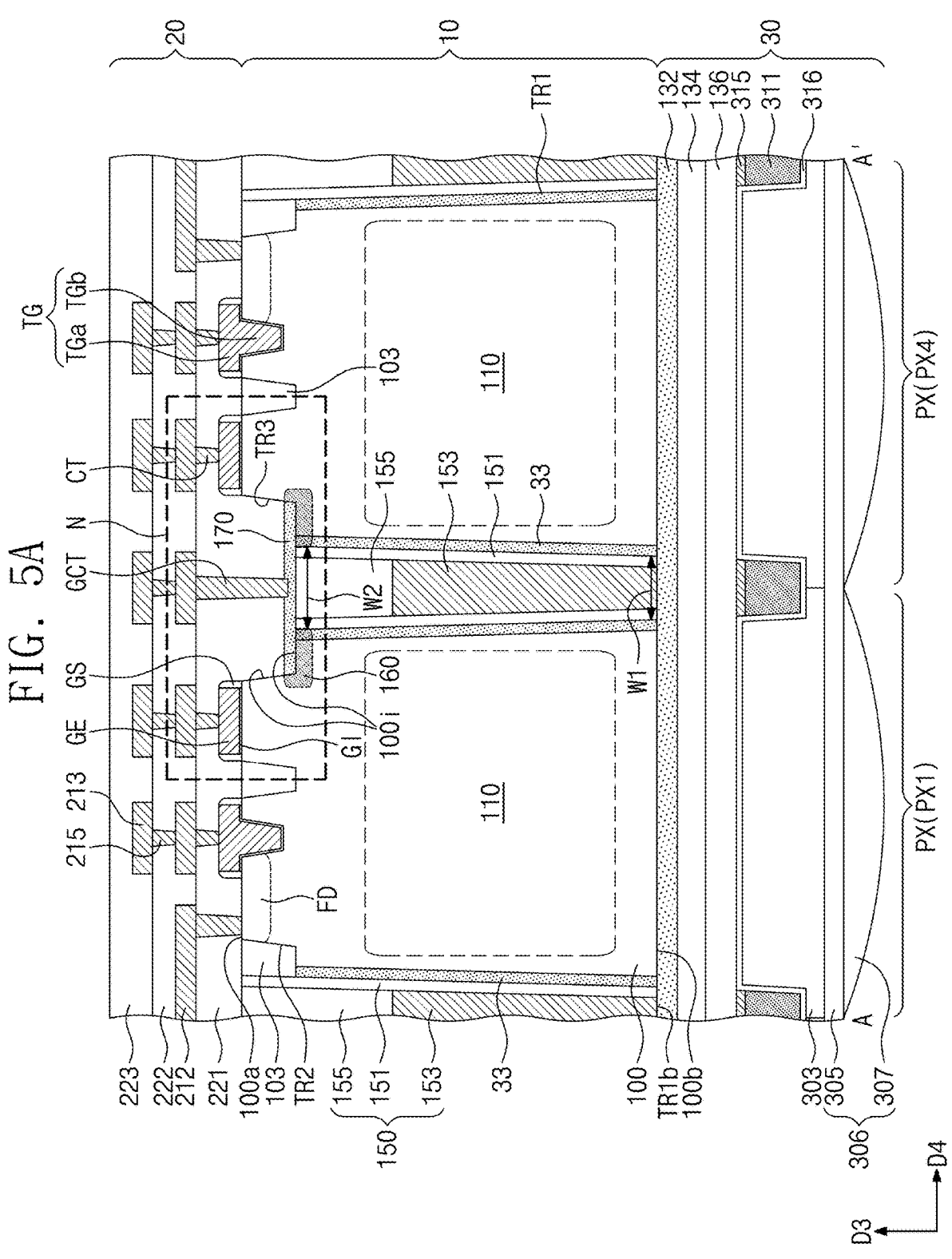
FIGS. 5A and 5B are cross-sectional views taken along lines A-A' and B-B' of FIG. 4, respectively.
Figure 5B:
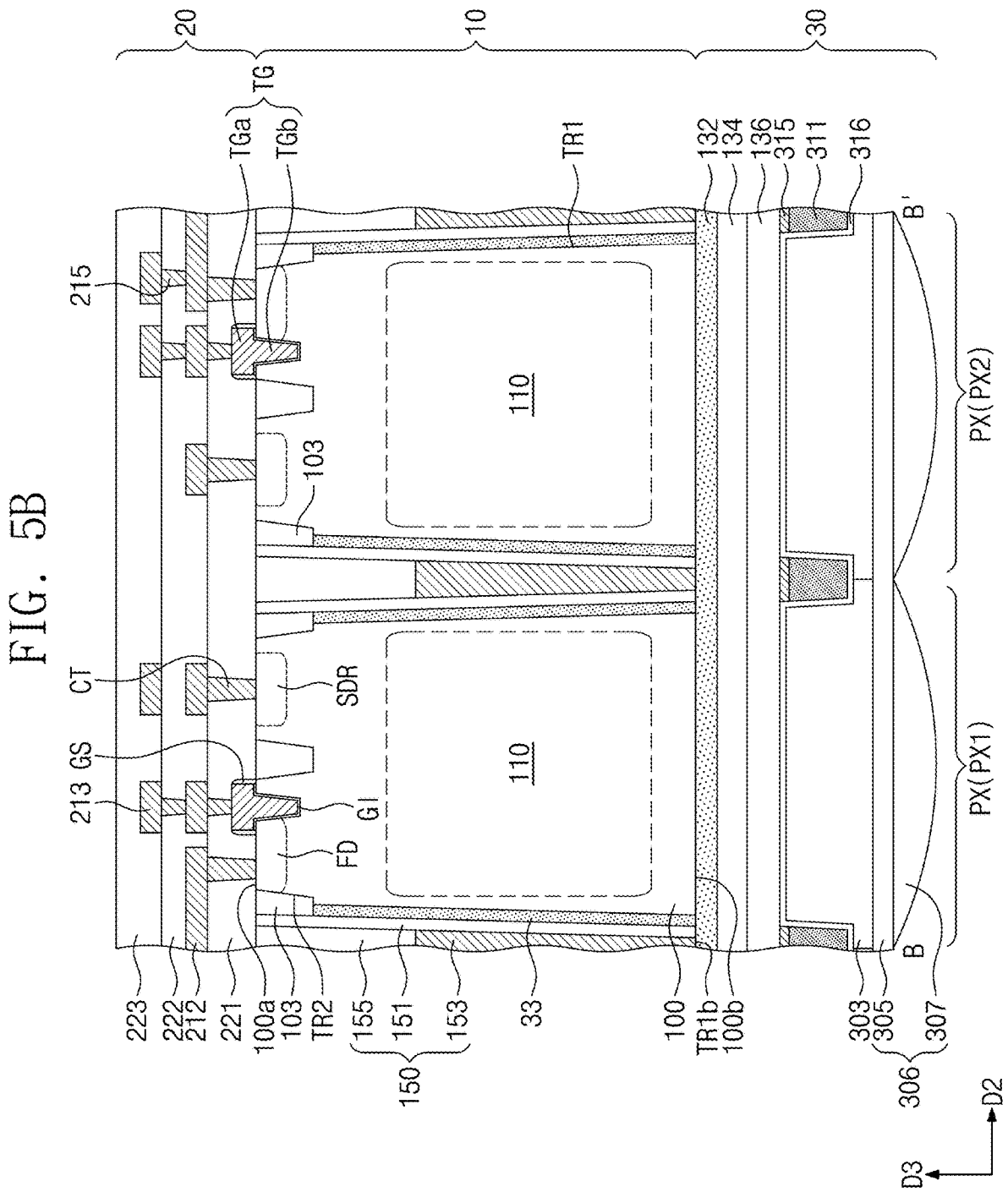
Figure 6:
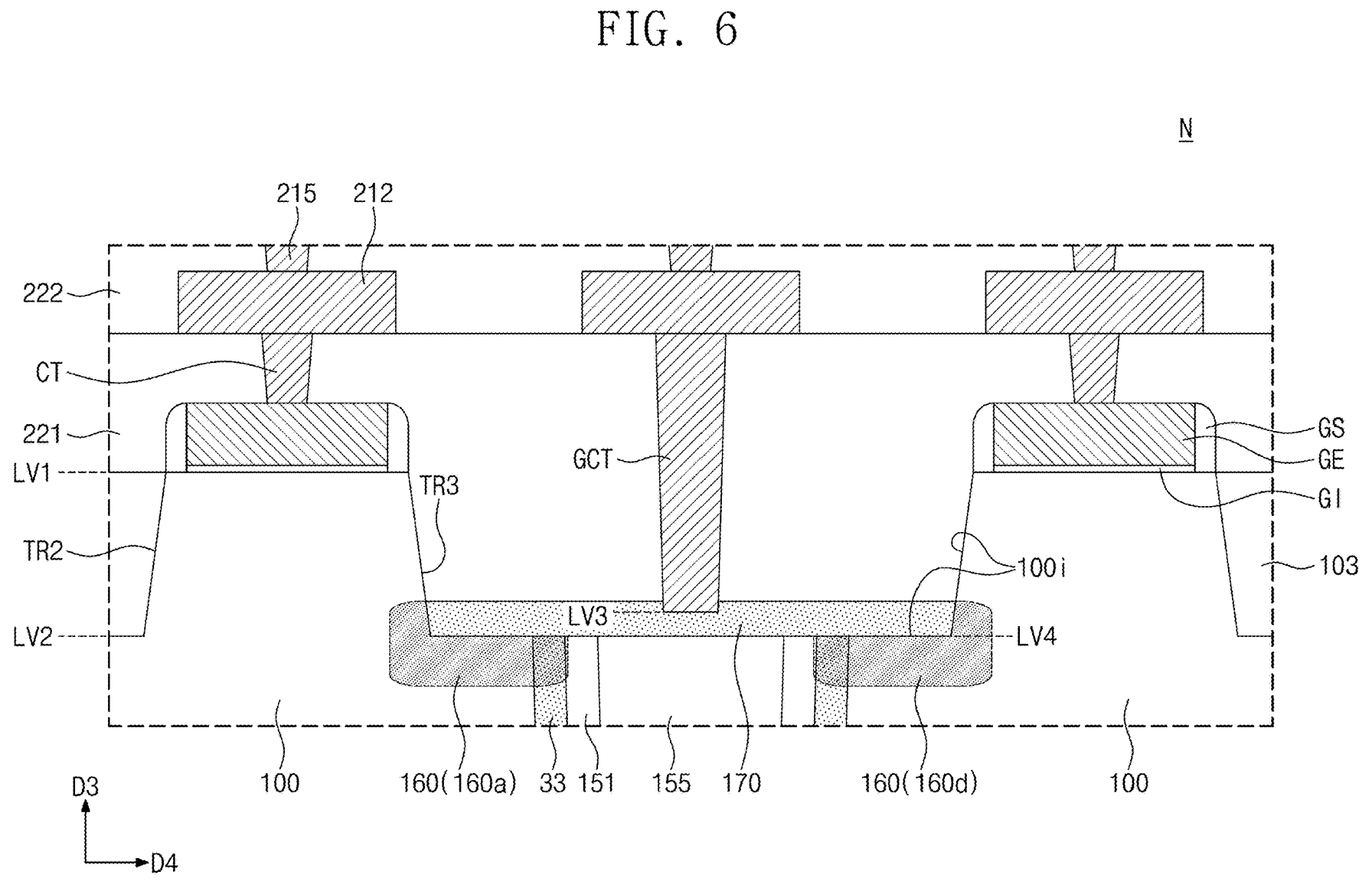

FIG. 4 is an enlarged plan view of a region 'M' of FIG. 2. FIGS. 5A and 5B are cross-sectional views taken along lines A-A' and B-B' of FIG. 4, respectively. FIG. 6 is an enlarged cross-sectional view of a region 'N' of FIG. 5A.

Referring to FIGS. 4, 5A and 5B, the image sensor may include the photoelectric conversion layer 10, the first interconnection layer 20, and the light transmitting layer 30. The photoelectric conversion layer 10 may include the first substrate 100, the pixel isolation pattern 150, and the device isolation pattern 103.

The first substrate 100 may include the first surface 100a and a second surface 100b, which are opposite to each other. Light may be incident to the second surface 100b of the first substrate 100. The first interconnection layer 20 may be disposed on the first surface 100a of the first substrate 100, and the light transmitting layer 30 may be disposed on the second surface 100b of the first substrate 100. The first substrate 100 may be a semiconductor substrate or a silicon-on-insulator (SOI) substrate. For example, the semiconductor substrate may include a silicon substrate, a germanium substrate, or a silicon-germanium substrate. The first substrate 100 may include dopants having a first conductivity type. For example, the dopants having the first conductivity type may include p-type dopants such as aluminum (Al), boron (B), indium (In), and/or gallium (Ga).

The first substrate 100 may include the plurality of unit pixel regions PX defined by the pixel isolation pattern 150. The plurality of unit pixel regions PX may be arranged in a matrix form in the first direction D1 and the second direction D2, which intersect each other. The first substrate 100 may include the photoelectric conversion regions 110. The photoelectric conversion regions 110 may be provided in the unit pixel regions PX in the first substrate 100, respectively. The photoelectric conversion regions 110 may perform the same function as the photodiodes PD1, PD2, PD3 and PD4 of FIG. 1.

The photoelectric conversion regions 110 may be regions doped with dopants having a second conductivity type in the first substrate 100. The second conductivity type may be opposite to the first conductivity type. The dopants having the second conductivity type may include n-type dopants such as phosphorus, arsenic, bismuth, and/or antimony. For example, the photoelectric conversion regions 110 may be adjacent to the second surface 100b of the first substrate 100. The photoelectric conversion regions 110 may be closer to the second surface 100b than to the first surface 100a. In some example embodiments, the photoelectric conversion regions 110 may be more adjacent to the first surface 100a of the first substrate 100. For example, each of the photoelectric conversion regions 110 may include a first region adjacent to the first surface 100a, and a second region adjacent to the second surface 100b. A dopant concentration of the first region of the photoelectric conversion region 110 may be different from a dopant concentration of the second region of the photoelectric conversion region 110. Thus, the photoelectric conversion region 110 may have a potential gradient between the first surface 100a and the second surface 100b of the first substrate 100. In some example embodiments, the photoelectric conversion region 110 may not have a potential gradient between the first surface 100a and the second surface 100b of the first substrate 100.

The first substrate 100 and the photoelectric conversion region 110 may constitute a photodiode. In other words, the photodiode may be formed by a p-n junction between the first substrate 100 having the first conductivity type and the photoelectric conversion region 110 having the second conductivity type. The photoelectric conversion region 110 forming the photodiode may generate and accumulate photocharges in proportion to the intensity of incident light.

The pixel isolation pattern 150 may be provided in the first substrate 100 and may define the unit pixel regions PX. For example, the pixel isolation pattern 150 may be provided between the unit pixel regions PX of the first substrate 100. The pixel isolation pattern 150 may have a lattice or grid structure when viewed in a plan view. The pixel isolation pattern 150 may completely surround each of the unit pixel regions PX when viewed in a plan view (e.g., in a horizontal plane in which one or more of the first, second, and fourth directions D1, D2, and D4 extend). The pixel isolation pattern 150 may be provided in a first trench TR1. The first trench TR1 may be recessed from the first surface 100a of the first substrate 100 and may be at least partially defined by one or more inner surfaces of the first substrate 100, as shown. The pixel isolation pattern 150 may extend from the first surface 100a of the first substrate 100 toward the second surface 100b of the first substrate 100. The pixel isolation pattern 150 may be a deep trench isolation (DTI) pattern. The pixel isolation pattern 150 may penetrate the first substrate 100. A vertical height of the pixel isolation pattern 150 may be substantially equal to a vertical thickness of the first substrate 100. A width of the pixel isolation pattern 150 (e.g., a width in one or more of the first, second, and fourth directions D1, D2, and D4 extending in the horizontal plane) may become progressively less from the first surface 100a of the first substrate 100 toward the second surface 100b of the first substrate 100. An upper width of the pixel isolation pattern 150 (e.g., a width of an upper end of the pixel isolation pattern 150 which is a distal end in relation to the second surface 100b of the first substrate 100) may be a second width W2. A lower width of the pixel isolation pattern 150 may be a first width W1 (e.g., a width of a lower end of the pixel isolation pattern 150 which is a proximate end in relation to the second surface 100b of the first substrate 100). The second width W2 may be greater than the first width W1.

The pixel isolation pattern 150 may include a first isolation pattern 151, a second isolation pattern 153, and a capping pattern 155. The first isolation pattern 151 may be provided along a sidewall of the first trench TR1. For example, the first isolation pattern 151 may include a silicon-based insulating material (e.g., silicon nitride, silicon oxide, and/or silicon oxynitride) and/or a high-k dielectric material (e.g., hafnium oxide and/or aluminum oxide). In some example embodiments, the first isolation pattern 151 may include a plurality of layers, and the layers may include different materials. The first isolation pattern 151 may have a refractive index lower than that of the first substrate 100. Thus, a cross-talk phenomenon between the unit pixel regions PX of the first substrate 100 may be reduced or prevented.

The second isolation pattern 153 may be provided in the inside of the first isolation pattern 151. For example, a sidewall of the second isolation pattern 153 may be surrounded by the first isolation pattern 151. The first isolation pattern 151 may be disposed between the second isolation pattern 153 and the first substrate 100. The second isolation pattern 153 may be spaced apart from the first substrate 100 by the first isolation pattern 151. Thus, when the image sensor operates, the second isolation pattern 153 may be electrically isolated from the first substrate 100. The second isolation pattern 153 may include a crystalline semiconductor material such as poly-silicon. For example, the second isolation pattern 153 may further include dopants, and the dopants may include dopants having the first conductivity type or dopants having the second conductivity type. For example, the second isolation pattern 153 may include doped poly-silicon. In some example embodiments, the second isolation pattern 153 may include an undoped crystalline semiconductor material. For example, the second isolation pattern 153 may include undoped poly-silicon. The term 'undoped' may mean that an intentional doping process is not performed.

The capping pattern 155 may be provided on a top surface of the second isolation pattern 153. The capping pattern 155 may be disposed adjacent to the first surface 100a of the first substrate 100. The capping pattern 155 may include a non-conductive material. For example, the capping pattern 155 may include a silicon-based insulating material (e.g., silicon nitride, silicon oxide, and/or silicon oxynitride) and/or a high-k dielectric material (e.g., hafnium oxide and/or aluminum oxide). Thus, the pixel isolation pattern 150 may reduce or prevent photocharges generated by light incident into each of the unit pixel regions PX from being inputted into neighboring unit pixel regions PX by random drift. In other words, the pixel isolation pattern 150 may reduce or prevent a cross-talk phenomenon between the unit pixel regions PX.

A barrier dopant region 33 may be provided along a sidewall of the pixel isolation pattern 150. The barrier dopant region 33 may be provided in the first substrate 100 adjacent to a sidewall of the first isolation pattern 151. The barrier dopant region 33 may include dopants having the first conductivity type (e.g., a p-type). A dopant concentration of the barrier dopant region 33 may be higher than a dopant concentration of the first substrate 100. The barrier dopant region 33 may inhibit a dark current from being generated by electron-hole pairs generated by surface defects of the first trench TR1.

The device isolation pattern 103 may be provided in the first substrate 100. For example, the device isolation pattern 103 may be provided in a second trench TR2. The second trench TR2 may be recessed from the first surface 100a of the first substrate 100. The device isolation pattern 103 may be a shallow trench isolation (STI) pattern. A bottom surface of the device isolation pattern 103 may be provided in the first substrate 100. A width of the device isolation pattern 103 may become progressively less from the first surface 100a of the first substrate 100 toward the second surface 100b of the first substrate 100. The bottom surface of the device isolation pattern 103 may be vertically spaced apart from the photoelectric conversion regions 110. Elements that are described herein to be vertically spaced apart may be understood to be spaced apart in a vertical direction which may extend perpendicular to the first surface 100a of the first substrate 100 and/or may extend perpendicular to the second surface 100b of the first substrate 100; for example the vertical direction may be the third direction D3. The pixel isolation pattern 150 may overlap with a portion of the device isolation pattern 103. At least a portion of the device isolation pattern 103 may be disposed on the sidewall of the pixel isolation pattern 150 and may be in contact with the sidewall of the pixel isolation pattern 150. A sidewall and the bottom surface of the device isolation pattern 103 and the sidewall of the pixel isolation pattern 150 may constitute a stepped structure. The pixel isolation pattern 150 may penetrate the device isolation pattern 103. A depth of the device isolation pattern 103 may be less than a depth of the pixel isolation pattern 150. The device isolation pattern 103 may include a silicon-based insulating material. For example, the device isolation pattern 103 may include silicon nitride, silicon oxide, and/or silicon oxynitride. In some example embodiments, the device isolation pattern 103 may include a plurality of layers, and the layers may include different materials.

Each of the unit pixel regions PX may include a first active pattern ACT1 and a second active pattern ACT2. The first active pattern ACT1 and the second active pattern ACT2 may be defined by the device isolation pattern 103. The first active pattern ACT1 and the second active pattern ACT2 may be isolated from each other by the device isolation pattern 103. The first active pattern ACT1 may have a tetragonal shape in a plan view, and the second active pattern ACT2 may have an L-shape in a plan view. The planar shapes of the first and second active patterns ACT1 and ACT2 and planar shapes of a gate electrode GE, a transfer gate TG and a ground dopant region 160 to be described later are not limited to the shapes illustrated in FIG. 4 but may be variously changed.

The transfer transistor TX, the source follower transistor SX, the reset transistor RX, the dual conversion transistor DCX and the selection transistor AX described above with reference to FIG. 1 may be provided on the first surface 100a of the first substrate 100. The transfer transistor TX may be provided on the first active pattern ACT1. One of the source follower transistor SX, the reset transistor RX, the dual conversion transistor DCX and the selection transistor AX may be provided on the second active pattern ACT2. The transfer transistor TX may be electrically connected to the photoelectric conversion region 110. The transfer transistor TX may include a transfer gate TG and a floating diffusion region FD. The transfer gate TG may include a first portion TGa provided on the first surface 100a of the first substrate 100, and a second portion TGb extending from the first portion TGa into the first substrate 100. A maximum width of the first portion TGa may be greater than a maximum width of the second portion TGb. A gate dielectric pattern GI may be disposed between the transfer gate TG and the first substrate 100. The gate dielectric pattern GI may extend along a bottom surface and sidewalls of the second portion TGb. The floating diffusion region FD may be disposed adjacent to a side of the transfer gate TG. The floating diffusion region FD may have the second conductivity type (e.g., an n-type) opposite to the first conductivity type of the first substrate 100.

Gate electrodes GE may be provided on the first surface 100a of the first substrate 100. The gate electrode GE may be one of the selection gate SEL, the source follower gate SF, the dual conversion gate DCG and the reset gate RG, described with reference to FIG. 1. Each of the source follower transistor SX, the reset transistor RX, the dual conversion transistor DCX and the selection transistor AX may include the gate electrode GE and source/drain regions SDR. The gate dielectric pattern GI may be disposed between the gate electrode GE and the first substrate 100. A gate spacer GS may be provided on a sidewall of each of the gate electrodes GE. The gate spacer GS may also be provided on a sidewall of the first portion TGa of the transfer gate TG. For example, the gate spacer GS may include silicon nitride, silicon carbonitride, or silicon oxynitride. The source/drain regions SDR may be provided in the first substrate 100. The source/drain region SDR may be a doped region in the second active pattern ACT2. For example, the source/drain region SDR may have the second conductivity type (e.g., the n-type) opposite to the first conductivity type of the first substrate 100.

Each of the unit pixel regions PX may include a ground dopant region 160 provided in the first substrate 100. The ground dopant region 160 may be adjacent to the first surface 100a of the first substrate 100. A bottom surface of the ground dopant region 160 may be spaced apart from the photoelectric conversion region 110. The ground dopant region 160 may be a doped region in the first substrate 100. For example, the ground dopant region 160 may have the same conductivity type (i.e., the first conductivity type (e.g., the p-type)) as the first substrate 100.

The unit pixel regions PX may include a first pixel region PX1, a second pixel region PX2, a third pixel region PX3, and a fourth pixel region PX4. The second pixel region PX2 may be adjacent to the first pixel region PX1 in the second direction D2. The third pixel region PX3 may be adjacent to the first pixel region PX1 in the first direction D1. The fourth pixel region PX4 may be adjacent to the second pixel region PX2 in the first direction D1. The fourth pixel region PX4 may be adjacent to the third pixel region PX3 in the second direction D2.

A third trench TR3 recessed from the first surface 100a of the first substrate 100 may be provided. For example, the first substrate 100 may include one or more inner surfaces 100i which are proximate to the second surface 100b in relation to the first surface 100a in the third direction D3 and at least partially define the third trench TR3. The one or more inner surfaces 100i may at least partially define one or more sidewalls and/or a bottom surface of the third trench TR3. The third trench TR3 may expose the pixel isolation pattern 150, the barrier dopant region 33, and the first substrate 100. For example, the third trench TR3 may have a circular shape when viewed in a plan view. The third trench TR3 may vertically overlap with a portion of each of the first to fourth pixel regions PX1 to PX4. Elements that are described herein to vertically overlap one or more other elements may be understood to at least partially overlap the one or more other elements in a vertical direction which may extend perpendicular to the first surface 100a of the first substrate 100 and/or may extend perpendicular to the second surface 100b of the first substrate 100; for example the vertical direction may be the third direction D3.

The ground dopant regions 160 may include a first ground dopant region 160a in the first pixel region PX1, a second ground dopant region 160b in the second pixel region PX2, a third ground dopant region 160c in the third pixel region PX3, and a fourth ground dopant region 160d in the fourth pixel region PX4. Each of the first to fourth ground dopant regions 160a, 160b, 160c and 160d may be disposed adjacent to the third trench TR3 when viewed in a plan view. In other words, the first to fourth ground dopant regions 160a, 160b, 160c and 160d may be disposed adjacent to each other with the pixel isolation pattern 150 interposed therebetween. A portion of each of the first to fourth ground dopant regions 160a, 160b, 160c and 160d may overlap with the barrier dopant region 33.

A connection pattern 170 may be provided in the third trench TR3. The connection pattern 170 may cover a bottom surface of the third trench TR3. The connection pattern 170 may be in contact with the first to fourth ground dopant regions 160a, 160b, 160c and 160d. The connection pattern 170 may electrically connect the first to fourth ground dopant regions 160a, 160b, 160c and 160d to each other. For example, the connection pattern 170 may include poly-silicon doped with p-type dopants (e.g., boron). For certain examples, the connection pattern 170 may include a metal material (e.g., tungsten, copper, aluminum and/or titanium) and/or a metal nitride (e.g., titanium nitride).

The first interconnection layer 20 may include insulating layers 221, 222 and 223, interconnection lines 212 and 213, vias 215, contacts CT, and a ground contact GCT. The insulating layers 221, 222 and 223 may include a first insulating layer 221, a second insulating layer 222, and a third insulating layer 223. The first insulating layer 221 may cover the first surface 100a of the first substrate 100. The first insulating layer 221 may cover the gate electrodes GE and the transfer gates TG. The first insulating layer 221 may extend into the third trench TR3. The second insulating layer 222 may be provided on the first insulating layer 221. The third insulating layer 223 may be provided on the second insulating layer 222. The first to third insulating layers 221, 222 and 223 may include a non-conductive material. For example, the first to third insulating layers 221, 222 and 223 may include a silicon-based insulating material such as silicon oxide, silicon nitride, and/or silicon oxynitride.

The interconnection lines 212 and 213 may be provided on the first insulating layer 221. The interconnection lines 212 and 213 may include first interconnection lines 212 and second interconnection lines 213. The first interconnection lines 212 may be provided in the second insulating layer 222. The second interconnection lines 213 may be provided in the third insulating layer 223. The vias 215 may be provided in the second insulating layer 222. The vias 215 may electrically connect the first and second interconnection lines 212 and 213 to each other. Some of the first and second interconnection lines 212 and 213 may be electrically connected to the transfer gate TG, the gate electrode GE, and the floating diffusion region FD through the contacts CT. One of the first interconnection lines 212 may be electrically connected to the connection pattern 170 and the ground dopant region 160 through the ground contact GCT. The ground contact GCT may vertically overlap with the pixel isolation pattern 150. In some example embodiments, the ground contact GCT may be horizontally offset from the pixel isolation pattern 150.

The contacts CT and the ground contact GCT may penetrate the first insulating layer 221. The interconnection lines 212 and 213 may be arranged regardless of the arrangement of the photoelectric conversion regions 110, and the arrangement of the interconnection lines 212 and 213 are not limited to the illustrated arrangement but may be variously changed. The first and second interconnection lines 212 and 213, the vias 215, the contacts CT and the ground contact GCT may include a metal material. For example, the first and second interconnection lines 212 and 213, the vias 215, the contacts CT and the ground contact GCT may include copper (Cu).

Referring again to FIG. 3, the image sensor may further include the logic chip 2000. The logic chip 2000 may be stacked on the sensor chip 1000. The logic chip 2000 may include a second substrate 40 and a second interconnection layer 45. The second interconnection layer 45 may be disposed between the first interconnection layer 20 and the second substrate 40.

In the optical black region OB, a first connection structure 50, a first pad terminal 81 and a bulk color filter 90 may be provided on the first substrate 100. The first connection structure 50 may include a first light blocking pattern 51, a first insulating pattern 53, and a first capping layer 55. The first light blocking pattern 51 may be provided on the second surface 100*b* of the first substrate 100. The first light blocking pattern 51 may conformally cover inner surfaces of a fourth trench TR4 and a fifth trench TR5. The first light blocking pattern 51 may penetrate the photoelectric conversion layer 10, the first interconnection layer 20 and at least a portion of the second interconnection layer 45 to electrically connect the photoelectric conversion layer 10 and the first interconnection layer 20. More particularly, the first light blocking pattern 51 may be in contact with corresponding ones of the interconnection lines in the first interconnection layer 20 and the pixel isolation pattern 150 in the photoelectric conversion layer 10. Thus, the first connection structure 50 may be electrically connected to the interconnection lines in the first interconnection layer 20. The first light blocking pattern 51 may block light incident to the optical black region OB.

The first pad terminal 81 may be provided in the fourth trench TR4 to fill a remaining portion of the fourth trench TR4. The first pad terminal 81 may include a metal material such as aluminum. The first pad terminal 81 may be connected to the pixel isolation pattern 150 (more particularly, the second isolation pattern 153). Thus, a negative voltage may be applied to the pixel isolation pattern 150 through the first pad terminal 81.

The first insulating pattern 53 may be provided on the first light blocking pattern 51 to fill a remaining portion of the fifth trench TR5. The first insulating pattern 53 may penetrate the photoelectric conversion layer 10 and the first interconnection layer 20. The first capping layer 55 may be provided on the first insulating pattern 53. The first capping layer 55 may include the same material as the capping pattern 155.

The bulk color filter 90 may be provided on the first pad terminal 81, the first light blocking pattern 51, and the first capping layer 55. The bulk color filter 90 may cover the first pad terminal 81, the first light blocking pattern 51, and the first capping layer 55. A first protective layer 71 may be provided on the bulk color filter 90 to cover the bulk color filter 90.

A photoelectric conversion region 110' and the dummy region 111 may be provided in the optical black region OB of the first substrate 100. For example, the photoelectric conversion region 110' may be doped with dopants having the second conductivity type (e.g., the n-type) different from the first conductivity type. The photoelectric conversion region 110' may have a similar structure to that of photoelectric conversion region 110 described in FIG. 5A but may not perform the operation of receiving light to generate an electrical signal. The dummy region 111 may be a region not doped with dopants. Signals generated from the photoelectric conversion region 110' and the dummy region 111 may be used as data for removing a process noise.

In the pad region PAD, a second connection structure 60, the second pad terminal 83 and a second protective layer 73 may be provided on the first substrate 100. The second connection structure 60 may include a second light blocking pattern 61, a second insulating pattern 63, and a second capping layer 65.

The second light blocking pattern 61 may be provided on the second surface 100*b* of the first substrate 100. More particularly, the second light blocking pattern 61 may conformally cover inner surfaces of a sixth trench TR6 and a seventh trench TR7. The second light blocking pattern 61 may penetrate the photoelectric conversion layer 10 and the first interconnection layer 20. More particularly, the second light blocking pattern 61 may be in contact with corresponding one(s) of interconnection lines 231 and 232 in the second interconnection layer 45. The second light blocking pattern 61 may include a metal material such as tungsten.

The second pad terminal 83 may be provided in the sixth trench TR6. The second pad terminal 83 may be provided on the second light blocking pattern 61 to fill a remaining portion of the sixth trench TR6. The second pad terminal 83 may include a metal material such as aluminum. The second pad terminal 83 may function as an electrical connection path between the image sensor and an external device. The second insulating pattern 63 may fill a remaining portion of the seventh trench TR7. The second insulating pattern 63 may penetrate the photoelectric conversion layer 10 and the first interconnection layer 20. The second capping layer 65 may be provided on the second insulating pattern 63. The second capping layer 65 may include the same material as the capping pattern 155. The second protective layer 73 may cover a portion of the second light blocking pattern 61 and the second capping layer 65.

A current applied through the second pad terminal 83 may flow to the pixel isolation pattern 150 through the second light blocking pattern 61, the interconnection lines 231 and 232 of the second interconnection layer 45 and the first light blocking pattern 51. Electrical signals generated from the photoelectric conversion regions 110 and 110' and the dummy region 111 may be transmitted to the outside through the interconnection lines of the first interconnection layer 20, the interconnection lines 231 and 232 of the second interconnection layer 45, the second light blocking pattern 61 and the second pad terminal 83.

The light transmitting layer 30 may include color filters 303 and a micro lens portion 306. The light transmitting layer 30 may concentrate and filter light incident from the outside and may provide the concentrated and filtered light to the photoelectric conversion layer 10. The color filters 303 may be provided on the second surface 100*b* of the first substrate 100. The color filters 303 may be disposed on the unit pixel regions PX, respectively. The color filters 303 may include primary color filters. The color filters 303 may include first to third color filters having different colors. For example, the first to third color filters may include green, red and blue color filters, respectively. The first to third color filters may be arranged in a Bayer pattern type. In some example embodiments, the first to third color filters may have other colors such as cyan, magenta and/or yellow colors.

The light transmitting layer 30 may further include a first fixed charge layer 132, a second fixed charge layer 134 and a planarization layer 136, which are sequentially provided between the second surface 100*b* of the first substrate 100 and the color filters 303. The first fixed charge layer 132, the second fixed charge layer 134 and the planarization layer 136 may include different materials. For example, the first fixed charge layer 132 may include aluminum oxide, the second fixed charge layer 134 may include hafnium oxide, and the planarization layer 136 may include silicon oxide. The first fixed charge layer 132, the second fixed charge layer 134 and the planarization layer 136 may reduce or prevent reflection of light incident to the second surface 100*b* of the first substrate 100 to allow the light to smoothly reach the photoelectric conversion regions 110.

The micro lens portion 306 may be provided on the color filters 303. The micro lens portion 306 may include a flat portion 305 being in contact with the color filters 303, and micro lenses 307 provided on the flat portion 305 and disposed on the unit pixel regions PX, respectively. For example, the flat portion 305 may include an organic material. For certain examples, the flat portion 305 may include silicon oxide or silicon oxynitride. The micro lenses 307 may have convex shapes to concentrate light incident to the unit pixel regions PX. Each of the micro lenses 307 may vertically overlap with the photoelectric conversion region 110.

The light transmitting layer 30 may further include a low-refractive index pattern 311, a protective layer 316, and a light blocking pattern 315. The light blocking pattern 315 may be provided on a bottom surface of the planarization layer 136. The light blocking pattern 315 may vertically overlap with the pixel isolation pattern 150. In other words, the light blocking pattern 315 may have a lattice or grid structure. For example, the light blocking pattern 315 may include at least one of metals or metal nitrides, such as titanium, tantalum, tungsten, and titanium nitride.

The low-refractive index pattern 311 may be disposed between the color filters 303 adjacent to each other to separate the adjacent color filters 303 from each other. The low-refractive index pattern 311 may be disposed on a bottom surface of the light blocking pattern 315. The low-refractive index pattern 311 may vertically overlap with the pixel isolation pattern 150 and the light blocking pattern 315. In other words, the low-refractive index pattern 311 may have a lattice or grid structure. The low-refractive index pattern 311 may be formed of a material having a refractive index lower than that of the color filters 303. The low-refractive index pattern 311 may be formed of an organic material. For example, the low-refractive index pattern 311 may be a polymer layer including silica nanoparticles. Since the low-refractive index pattern 311 has the low refractive index, the amount of light incident to the photoelectric conversion region 110 may be increased, and cross-talk between the unit pixel regions PX may be reduced. In other words, light receiving efficiency of the photoelectric conversion regions 110 may be increased, and signal-to-noise ratio (SNR) characteristics of the photoelectric conversion regions 110 may be improved.

The protective layer 316 may cover a surface of the low-refractive index pattern 311 with a substantially uniform thickness. The protective layer 316 may further extend toward a bottom surface of each of the color filters 303. For example, the protective layer 316 may include a single layer or multi-layer including at least one of an aluminum oxide layer or a silicon oxycarbide layer. The protective layer 316 may protect the color filters 303 and may perform a moisture absorbing function.

The ground dopant region 160 and the connection pattern 170 will be described hereinafter in more detail with reference to FIG. 6.

Referring to FIG. 6, a topmost surface of the first substrate 100 may be coplanar with a top surface of the device isolation pattern 103. The topmost surface of the first substrate 100 and the top surface of the device isolation pattern 103 may be located at a first level LV1 and thus may be coplanar or substantially coplanar with each other. A bottom surface of the second trench TR2 may be located at a second level LV2. A bottom surface of the device isolation pattern 103 may be located at the second level LV2. A bottom surface of the contact CT may be located at a level which is substantially the same as the first level LV1 or is higher than the first level LV1.

A bottom surface of the ground contact GCT may be located at a third level LV3. The third level LV3 may be lower than the first level LV1. The third level LV3 may be higher than the second level LV2. A bottom surface of the third trench TR3 may be located at a fourth level LV4. For example, the fourth level LV4 may be substantially the same as the second level LV2. In some example embodiments, the fourth level LV4 may be different from the second level LV2. The third level LV3 may be higher than the fourth level LV4. The bottom surface of the ground contact GCT may be located at a lower level than the bottom surface of the contact CT.

The bottom surface of the ground contact GCT may be in contact with the connection pattern 170. For example, the third level LV3 may be located at a lower level than a top surface of the connection pattern 170. In some example embodiments, the third level LV3 may be located at substantially the same level as the top surface of the connection pattern 170.

In the present specification, the term 'level', 'vertical level', 'depth', 'height', or the like may mean a vertical height (e.g., vertical distance) measured from a reference location (e.g., the second surface 100b of the first substrate 100) in a direction perpendicular to the plane or surface at the reference location (e.g., a vertical direction perpendicular to the second surface 100b of the first substrate 100). For example, where a level of a first element (e.g., a first level) is described herein to be lower than a level of a second element (e.g., a second level), it will be understood that the distance of the first element (e.g., the first level) from the reference location (e.g., the second surface 100b of the first substrate 100) in the vertical direction may be smaller than the distance of the second element (e.g., the second level) from the reference location in the vertical direction. In another example, where a level of a first element (e.g., a first level) is described herein to be higher than a level of a second element (e.g., a second level), it will be understood that the distance of the first element (e.g., the first level) from the reference location (e.g., the second surface 100b of the first substrate 100) in the vertical direction may be greater than the distance of the second element (e.g., the second level) from the reference location in the vertical direction. In another example, where a level of a first element (e.g., a first level) is described herein to be the same or substantially the same as a level of a second element (e.g., a second level), it will be understood that the distance of the first element (e.g., the first level) from the reference location (e.g., the second surface 100b of the first substrate 100) in the vertical direction may be the same or substantially the same as the distance of the second element (e.g., the second level) from the reference location in the vertical direction.

The ground dopant region 160 may be formed along a sidewall and the bottom surface of the third trench TR3 (where the sidewall and the bottom surface of the third trench TR3 may be at least partially defined by one or more inner surfaces 100i of the first substrate 100). The ground dopant region 160 may be in contact with the sidewall and the bottom surface of the third trench TR3. A bottom surface of the ground dopant region 160 (e.g., a surface that is closest to the second surface 100b of the first substrate 100 in the third direction D3) may be located at a level lower than the fourth level LV4. The bottom surface of the ground dopant region 160 may be located at a lower level than a bottom surface of the floating diffusion region FD (see FIG. 5A). The ground dopant region 160 may be spaced apart from the topmost surface of the first substrate 100. In other words, the ground dopant region 160 may be located at a level lower than the first level LV1. A topmost surface of the ground dopant region 160 (e.g., a surface that is furthest from the second surface 100b of the first substrate 100 in the third direction D3). may be located at a level higher than the fourth level LV4. A portion of the ground dopant region 160 may overlap (e.g., vertically overlap) with the barrier dopant region 33 and may be adjacent to the first isolation pattern 151.

Figure 7:
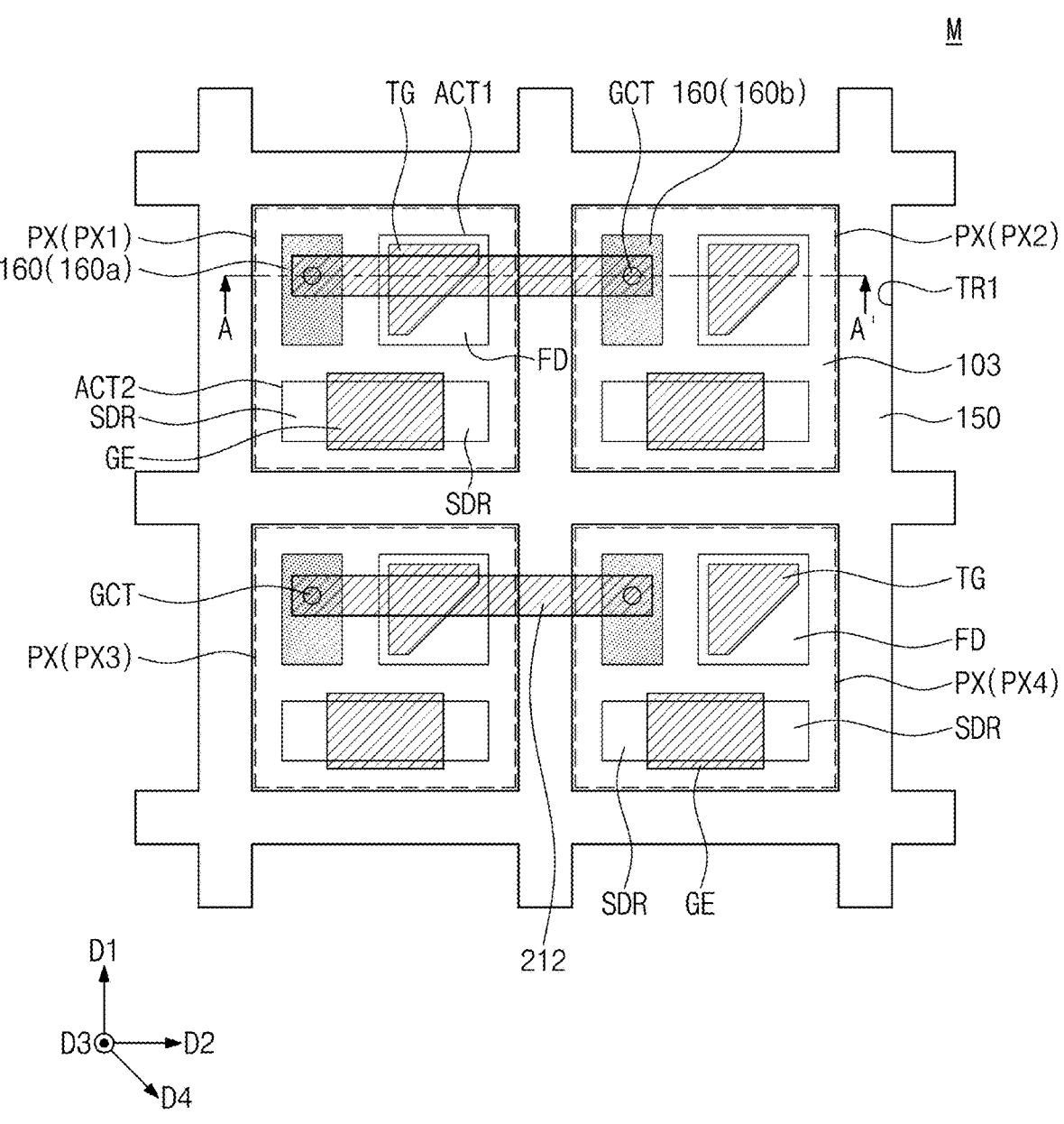
FIG. 7 is an enlarged plan view corresponding to the region 'M' of FIG. 2 to illustrate an image sensor according to a comparative example.
Figure 8:
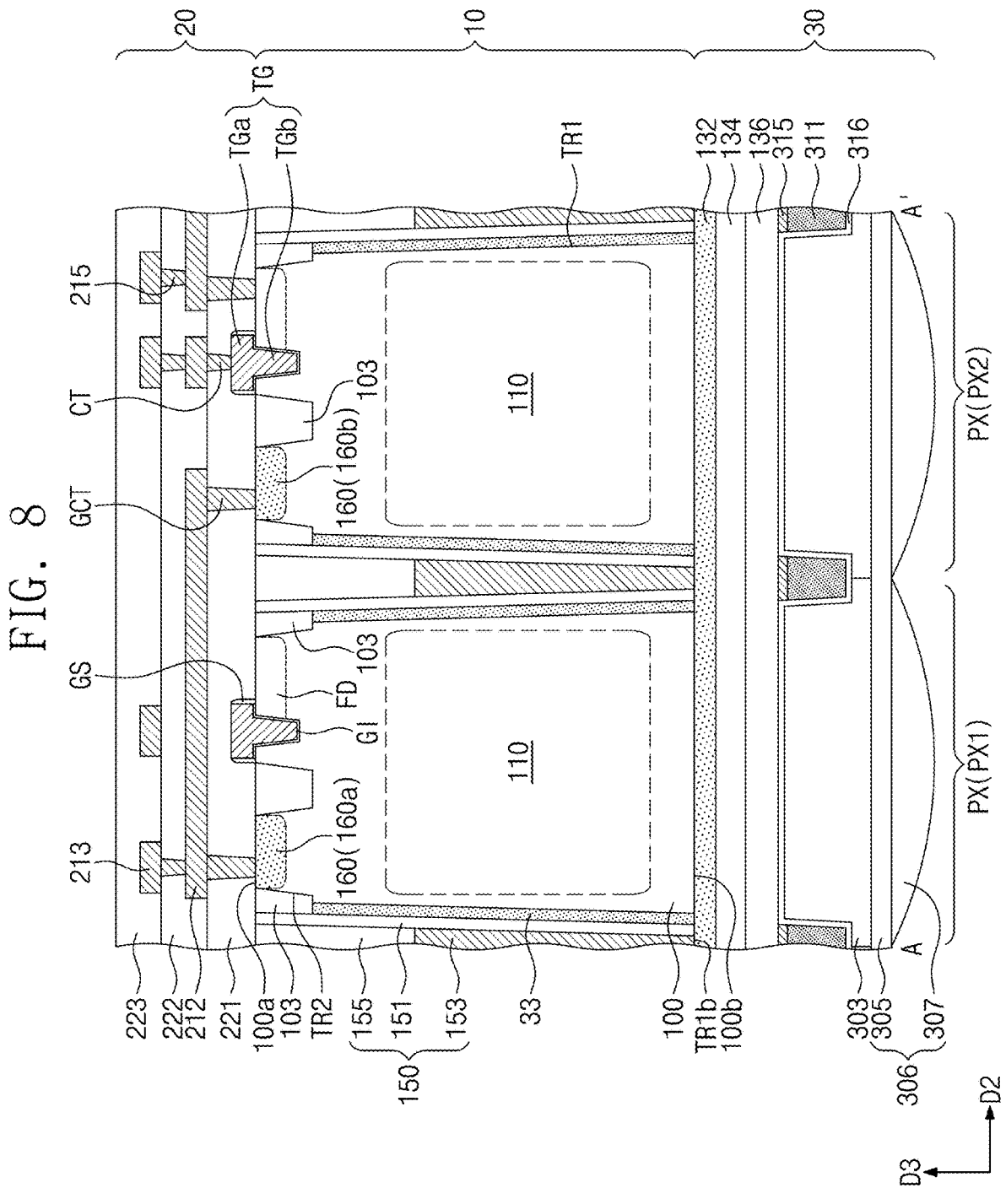
FIG. 8 is a cross-sectional view taken along a line A-A' of FIG. 7.

FIG. 7 is an enlarged plan view corresponding to the region 'M' of FIG. 2 to illustrate an image sensor according to a comparative example. FIG. 8 is a cross-sectional view taken along a line A-A' of FIG. 7. In the description of the comparative example, the descriptions to the same features as mentioned with reference to FIGS. 4, 5A and 5B will be omitted, and differences between the comparative example and the example embodiments shown in FIGS. 4, 5A, 5B, and 6 will be mainly described.

Referring to FIGS. 7 and 8, each of unit pixel regions PX may include a first active pattern ACT1 and a second active pattern ACT2. The first active pattern ACT1 and the second active pattern ACT2 may be defined by a device isolation pattern 103. The first active pattern ACT1 may have a tetragonal planar shape, and the second active pattern ACT2 may have a planar shape extending in the second direction D2.

A ground dopant region 160 may be adjacent to the first active pattern ACT1 in the second direction D2 and may be adjacent to the second active pattern ACT2 in the first direction D1. The ground dopant region 160 may be disposed adjacent to the first surface 100a of the first substrate 100. In other words, the ground dopant region 160 may be disposed adjacent to the topmost surface of the first substrate 100. A top surface of the ground dopant region 160 may be located at substantially the same level as a top surface of the floating diffusion region FD. When viewed in a plan view, a ratio of an area of the ground dopant region 160 to an area of the unit pixel region PX may be greater than that in FIG. 4.

First to fourth ground dopant regions 160a, 160b, 160c and 160d may not be disposed adjacent to each other. Ground contacts GCT may be connected to the first ground dopant region 160a and the second ground dopant region 160b, respectively. The ground contacts GCT may be connected to each other through one of first interconnection lines 212. The first interconnection line 212 connecting the ground contacts GCT may intersect a pixel isolation pattern 150 between a first pixel region PX1 and a second pixel region PX2.

Even though image sensors are becoming smaller, a specific area of the ground dopant region 160 for connection with the ground contact GCT should be secured. Thus, the ratio of the area of the ground dopant region 160 to the area of the unit pixel region PX may be increased.

In the comparative example, the ground dopant region 160 may be formed adjacent to the topmost surface of the first substrate 100. Widths and sizes of the active patterns defined by the device isolation pattern 103 may be reduced to secure an area in which the ground dopant region 160 is formed. When the widths and the sizes of the active patterns are reduced, a phenomenon that the active patterns are inclined may occur in manufacturing processes. Thus, failure or defects may occur in subsequent processes to deteriorate reliability of an image sensor.

In addition, when the area occupied by the ground dopant region 160 in the unit pixel region PX is increased, a size of a gate electrode GE formed on the unit pixel region PX may be reduced, and thus a distance between source/drain regions SDR may also be reduced. Accordingly, electrical failure (e.g., a short channel effect) may occur, and noise of an image sensor may be increased.

Furthermore, the first ground dopant region 160a in the first pixel region PX1 and the second ground dopant region 160b in the second pixel region PX2 may not be disposed adjacent to each other. Thus, the number (e.g., quantity) of the ground contacts GCT and the number (e.g., quantity) and lengths of the first interconnection lines 212 connecting the ground contacts GCT may be increased.

According to some example embodiments of the inventive concepts, including the example embodiments shown in at least FIGS. 4, 5A, 5B, and 6, the ground dopant region 160 may be formed along the bottom surface and the sidewall of the third trench TR3 exposing the pixel isolation pattern 150. Thus, an area occupied by the ground dopant region 160 in the unit pixel region PX in some example embodiments of the inventive concepts, including the example embodiments shown in at least FIGS. 4, 5A, 5B, and 6, may be greatly reduced. Therefore, a degree of freedom of a design of the image sensor in some example embodiments of the inventive concepts, including the example embodiments shown in at least FIGS. 4, 5A, 5B, and 6, may be increased, and a size of the second active pattern ACT2 on which the gate electrode GE and the source/drain region SDR are formed in some example embodiments of the inventive concepts, including the example embodiments shown in at least FIGS. 4, 5A, 5B, and 6, may be increased. As a result, electrical failure (e.g., a short channel effect) and noise of the image sensor in some example embodiments of the inventive concepts, including the example embodiments shown in at least FIGS. 4, 5A, 5B, and 6, may be reduced.

In addition, according to some example embodiments of the inventive concepts, including the example embodiments shown in at least FIGS. 4, 5A, 5B, and 6, the connection pattern 170 may be provided to connect the first to fourth ground dopant regions 160a, 160b, 160c and 160d, disposed adjacent to the third trench TR3, to each other. Thus, it is possible to reduce the number of the ground contact GCT and the number and a length of the first interconnection line 212 connected to the ground contact GCT. In other words, it is possible to reduce parasitic capacitances between the first interconnection lines 212 adjacent to each other and between the ground contacts GCT adjacent to each other. As a result, electrical characteristics of the image sensor in some example embodiments of the inventive concepts, including the example embodiments shown in at least FIGS. 4, 5A, 5B, and 6, may be improved.

Furthermore, widths and sizes of the active patterns may be relatively increased, and thus a phenomenon that the active patterns are inclined may be reduced or prevented to effectively reduce occurrence of failure or defects in processes of manufacturing the image sensor. As a result, reliability of the image sensor in some example embodiments of the inventive concepts, including the example embodiments shown in at least FIGS. 4, 5A, 5B, and 6, may be improved.

FIGS. 9A, 9B, 9C, 9D, 9E, 9F, and 9G are cross-sectional views taken along the line A-A' of FIG. 4 to illustrate a method of manufacturing an image sensor according to some example embodiments of the inventive concepts.

Figure 9A:
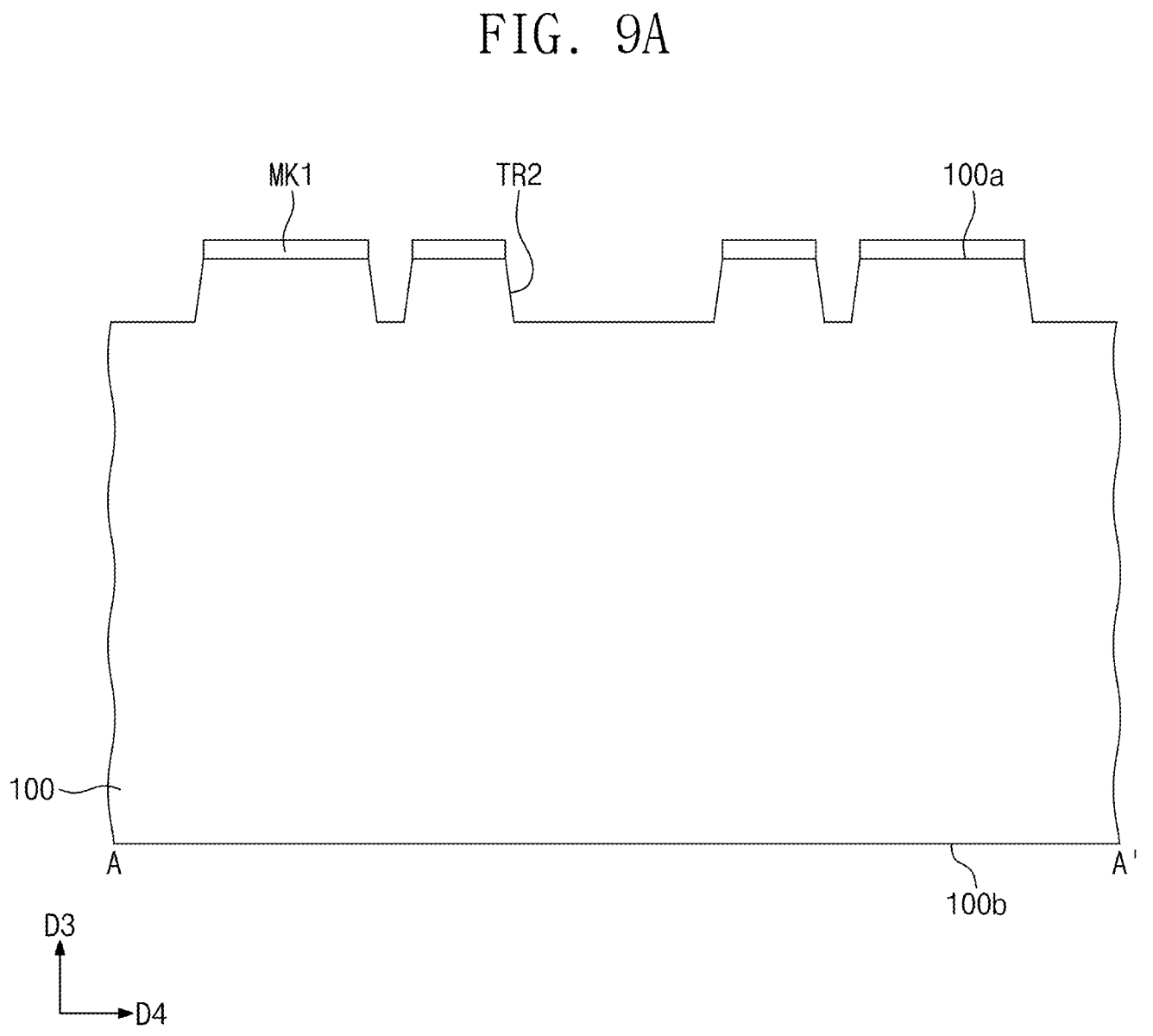

Referring to FIG. 9A, a first substrate 100 having first and second surfaces 100a and 100b opposite to each other may be prepared. The first substrate 100 may include dopants having a first conductivity type (e.g., a p-type). For example, the first substrate 100 may be a substrate in which an epitaxial layer having the first conductivity type is formed on a bulk silicon substrate having the first conductivity type. In some example embodiments, the first substrate 100 may be a bulk substrate including a well having the first conductivity type.

A second trench TR2 may be formed in the first surface 100*a* of the first substrate 100. The formation of the second trench TR2 may include forming a first mask pattern MK1 on the first surface 100*a* of the first substrate 100, and performing an etching process on the first surface 100*a* of the first substrate 100 by using the first mask pattern MK1 as an etch mask.

Figure 9B:
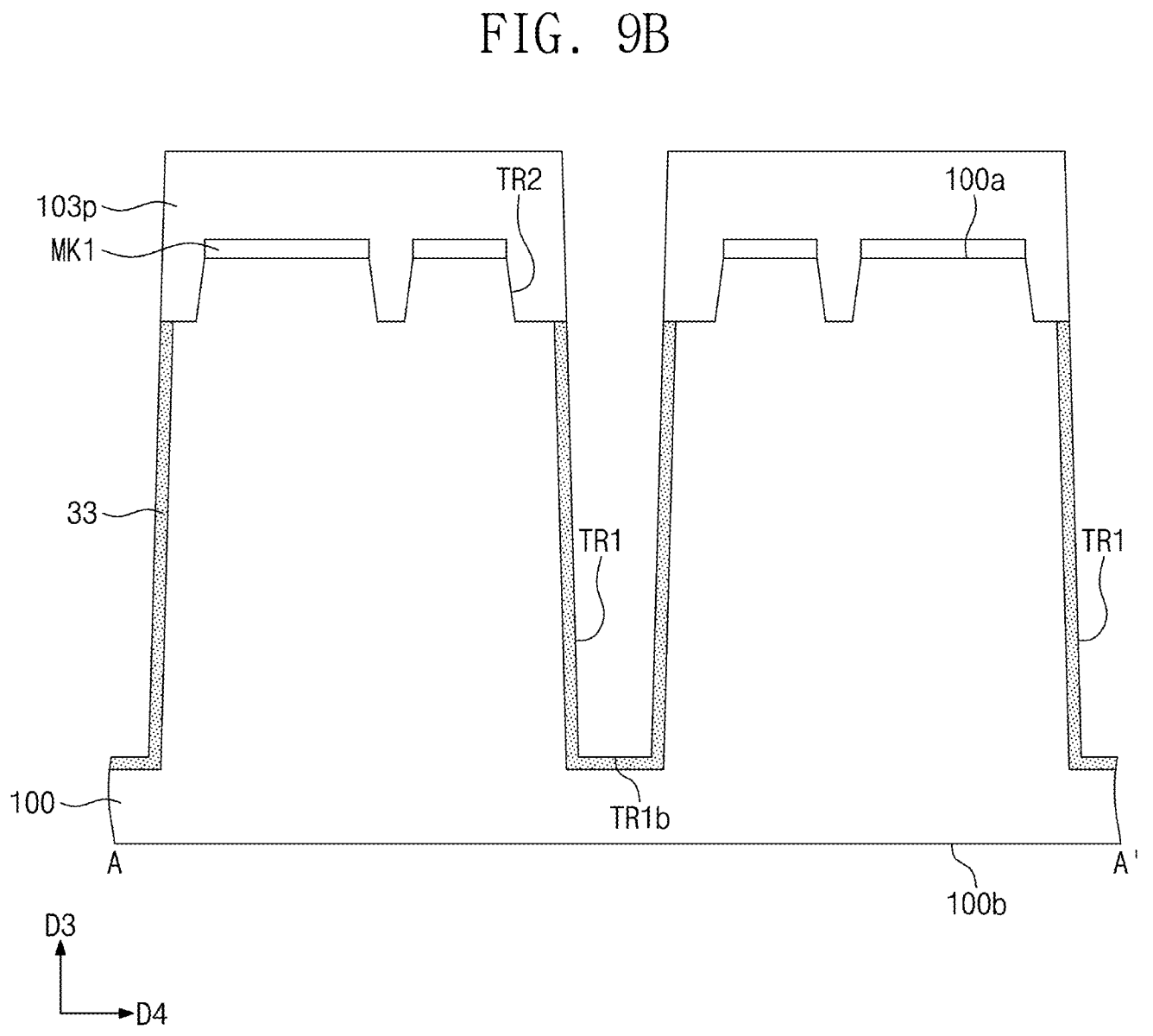

Referring to FIG. 9B, a first trench TR1 may be formed from the first surface 100*a* of the first substrate 100. Before the formation of the first trench TR1, a preliminary device isolation pattern 103*p* may be formed on the first surface 100*a* of the first substrate 100. The preliminary device isolation pattern 103*p* may be formed by performing a deposition process on the first surface 100*a* of the first substrate 100. The preliminary device isolation pattern 103*p* may completely fill the second trench TR2 and may cover the first mask pattern MK1. A top surface of the preliminary device isolation pattern 103*p* may be higher than the first surface 100*a* of the first substrate 100. A mask (not shown) may be formed on the preliminary device isolation pattern 103*p*, and the preliminary device isolation pattern 103*p* and the first substrate 100 may be anisotropically etched using the mask (not shown) as an etch mask to form the first trench TR1. A bottom surface TR1*b* of the first trench TR1 may be located at a higher level than the second surface 100*b* of the first substrate 100. For example, the preliminary device isolation pattern 103*p* may include silicon oxide, silicon nitride, and/or silicon oxynitride.

A barrier dopant region 33 may be formed in the first substrate 100 adjacent to the first trench TR1. In some example embodiments, the barrier dopant region 33 may be formed by performing a plasma doping process (PLAD) in the first trench TR1. In the plasma doping process, a source material may be supplied in a gaseous state into a process chamber. The source material may be ionized by plasma, and then, a bias of a high voltage may be applied to an electrostatic chuck (not shown) on which the first substrate 100 is loaded, thereby injecting the ionized source material into the first substrate 100. The plasma doping may realize substantially uniform doping at a relatively very deep position and may improve a doping speed. In some example embodiments, a sacrificial layer including dopants having the first conductivity type may be formed in a deep trench (i.e., the first trench TR1), and the dopants in the sacrificial layer may be diffused into the first substrate 100 by a thermal treatment process to form the barrier dopant region 33. The barrier dopant region 33 may include p-type dopants.

Figure 9C:
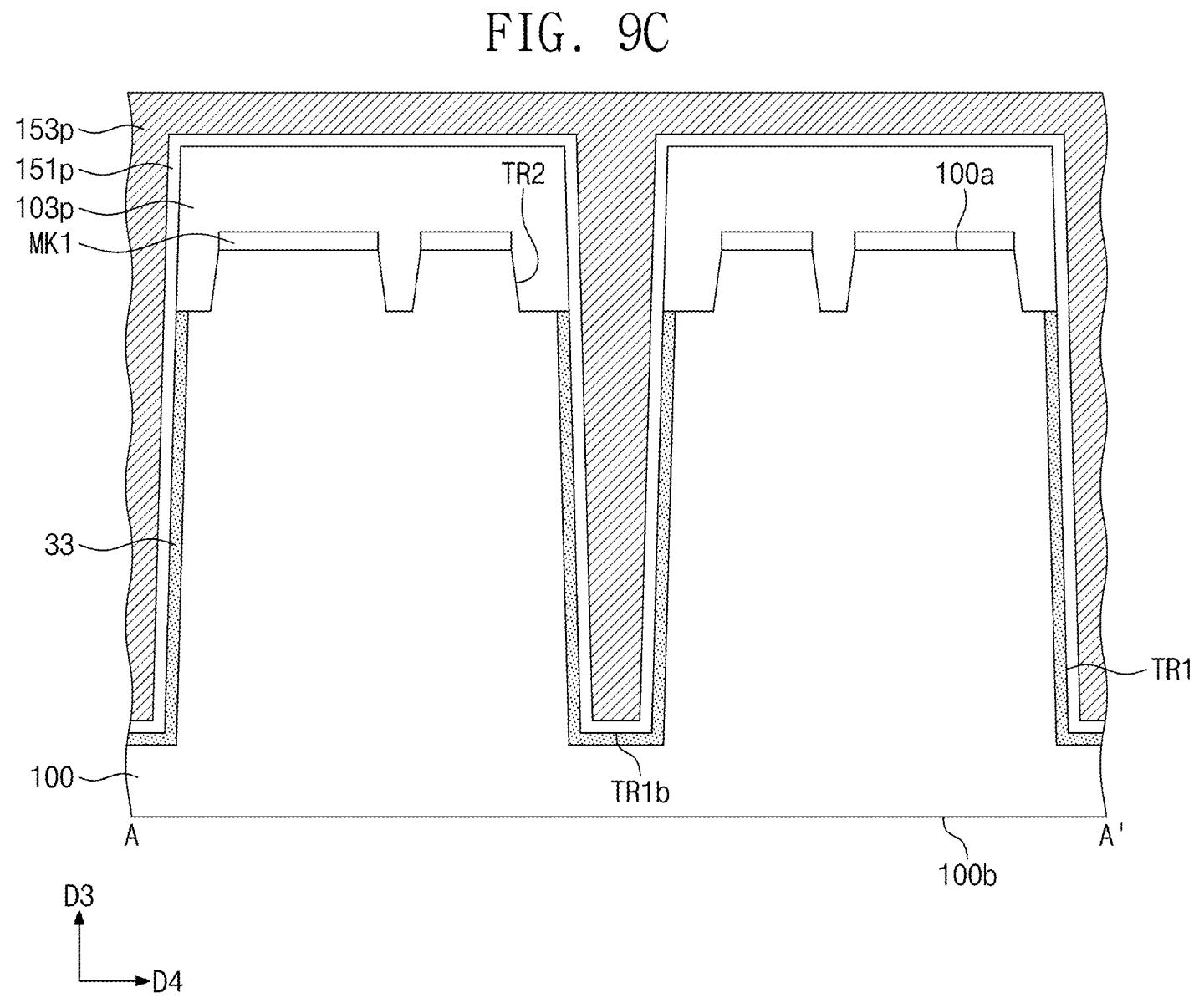

Referring to FIG. 9C, a first preliminary isolation pattern 151*p* may be formed to conformally cover an inner surface of the first trench TR1. The first preliminary isolation pattern 151*p* may cover the inner surface of the first trench TR1 and the top surface of the preliminary device isolation pattern 103*p*. The first preliminary isolation pattern 151*p* may be formed by depositing an insulating material on the first substrate 100 having the first trench TR1. For example, the first preliminary isolation pattern 151*p* may include silicon oxide, silicon nitride, and/or silicon oxynitride.

A second preliminary isolation pattern 153*p* may be formed on the first preliminary isolation pattern 151*p*. The second preliminary isolation pattern 153*p* may be formed by performing a deposition process on the first substrate 100 having the first preliminary isolation pattern 151*p*. The second preliminary isolation pattern 153*p* may cover the first preliminary isolation pattern 151*p* on the inner surface of the first trench TR1 and may cover the top surface of the preliminary device isolation pattern 103*p*. For example, the second preliminary isolation pattern 153*p* may include polysilicon.

Figure 9D:
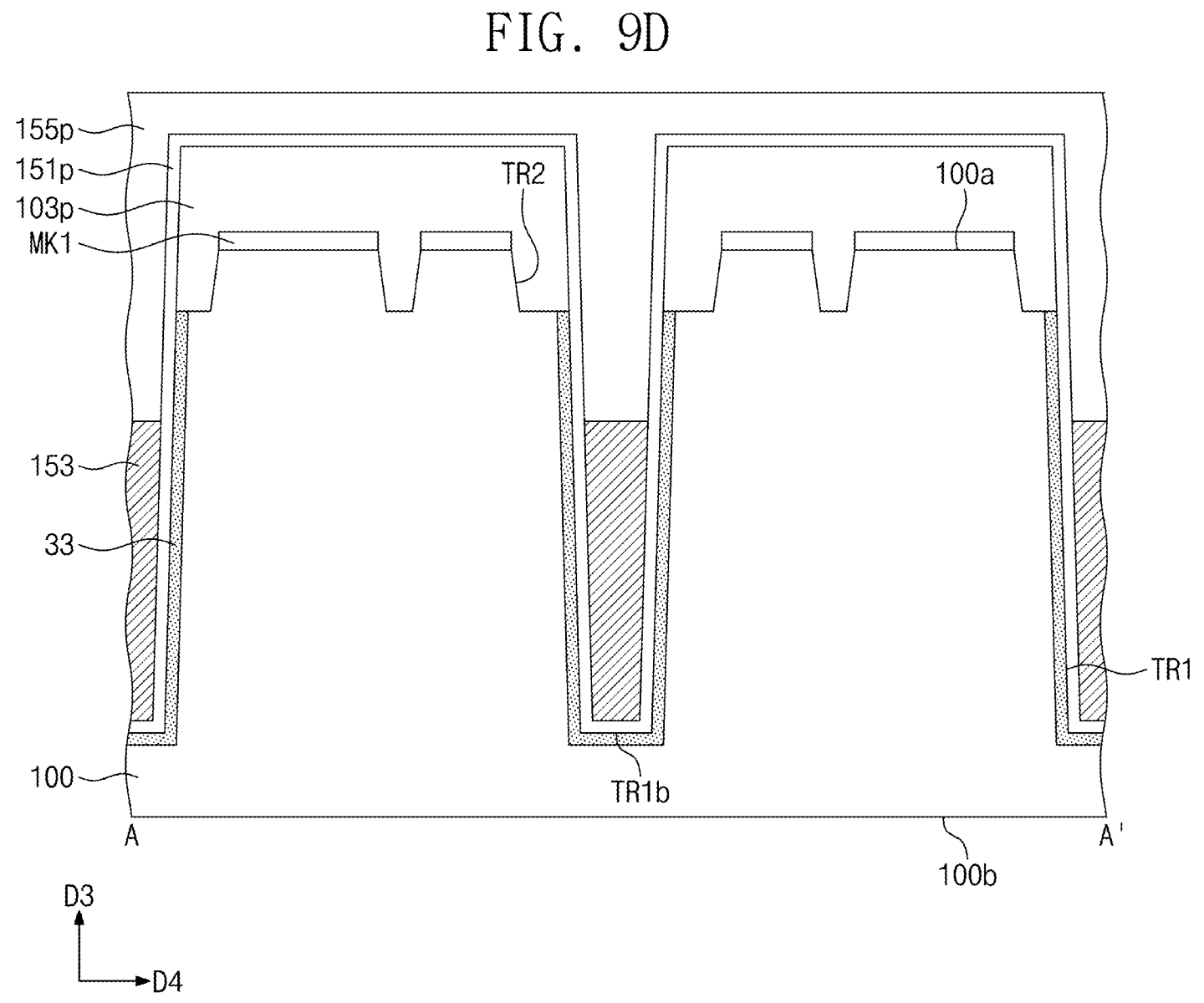

Referring to FIG. 9D, an upper portion of the second preliminary isolation pattern 153*p* may be removed by a first etching process to form a second isolation pattern 153. Thus, a portion of the first preliminary isolation pattern 151*p* may be exposed to the outside. The first etching process may be performed until a top surface of the second isolation pattern 153 is located at a lower level than a bottom surface of the preliminary device isolation pattern 103*p*.

According to some example embodiments, after the first etching process is performed, a doping process may be performed on the second isolation pattern 153. For example, the doping process may be a beam line ion implantation process or a plasma doping process (PLAD). Since the first trench TR1 is relatively deep and narrow, it may be difficult to uniformly dope the second isolation pattern 153 along a vertical depth by the beam line ion implantation process. Thus, when the doping process is performed by the beam line ion implantation process, a dopant concentration of the second isolation pattern 153 may be varied depending on the vertical depth. When a negative voltage is applied to the second isolation pattern 153 of the image sensor, a dark current of the image sensor may be reduced.

A preliminary capping pattern 155*p* may be formed to cover an entire top surface of the first substrate 100 and to fill an upper portion of the first trench TR1. The formation of the preliminary capping pattern 155*p* may include performing a deposition process on the first surface 100*a* of the first substrate 100. The preliminary capping pattern 155*p* may include silicon oxide, silicon nitride, and/or silicon oxynitride.

Figure 9E:
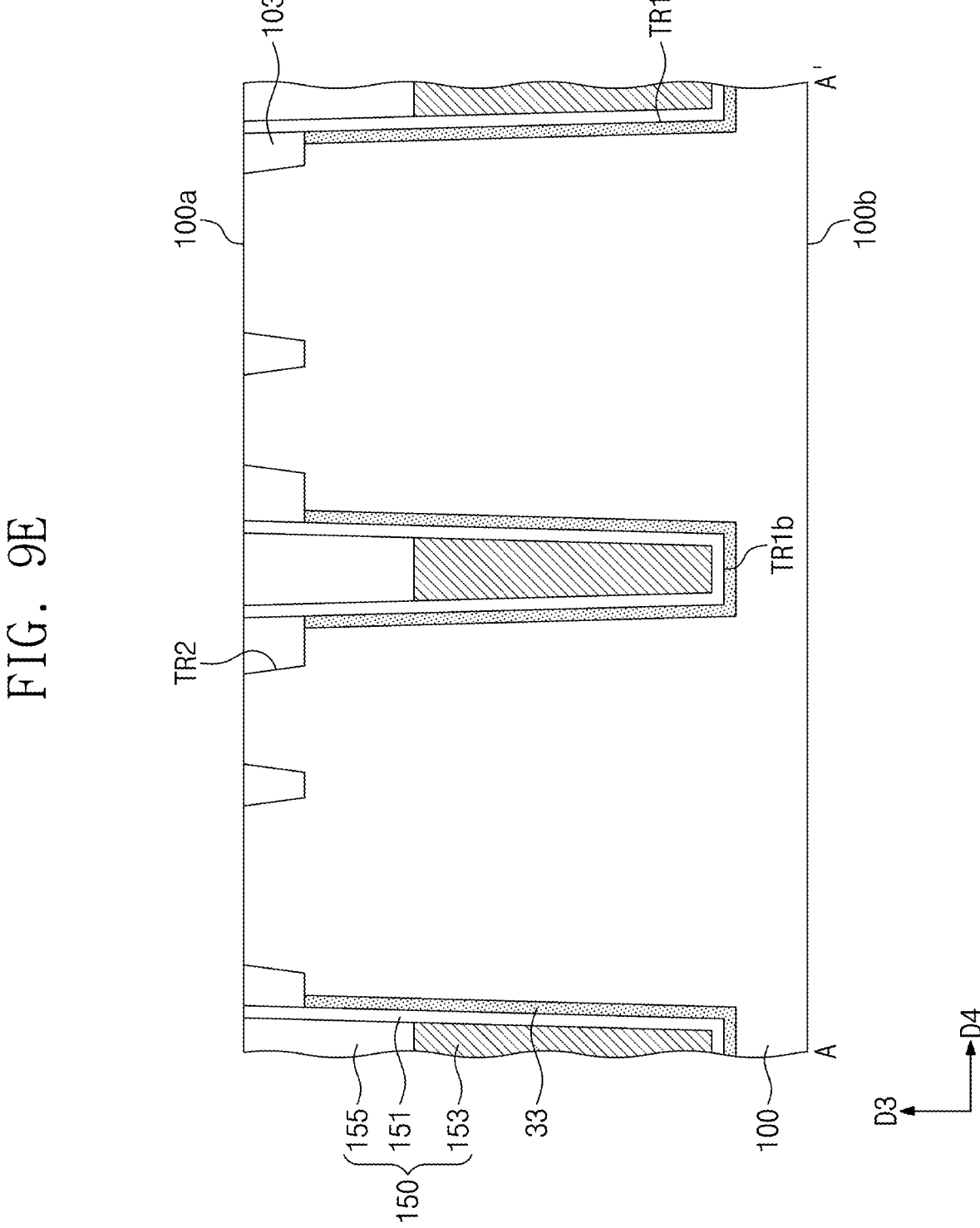

Referring to FIG. 9E, a capping pattern 155, a first isolation pattern 151 and a device isolation pattern 103 may be formed. The formation of the capping pattern 155, the first isolation pattern 151 and the device isolation pattern 103 may include performing a planarization process on the first surface 100*a* of the first substrate 100. In some example embodiments, the first mask pattern MK1 may be removed after the planarization process, and thus damage of the first surface 100*a* of the first substrate 100 may be reduced or prevented.

Figure 9F:
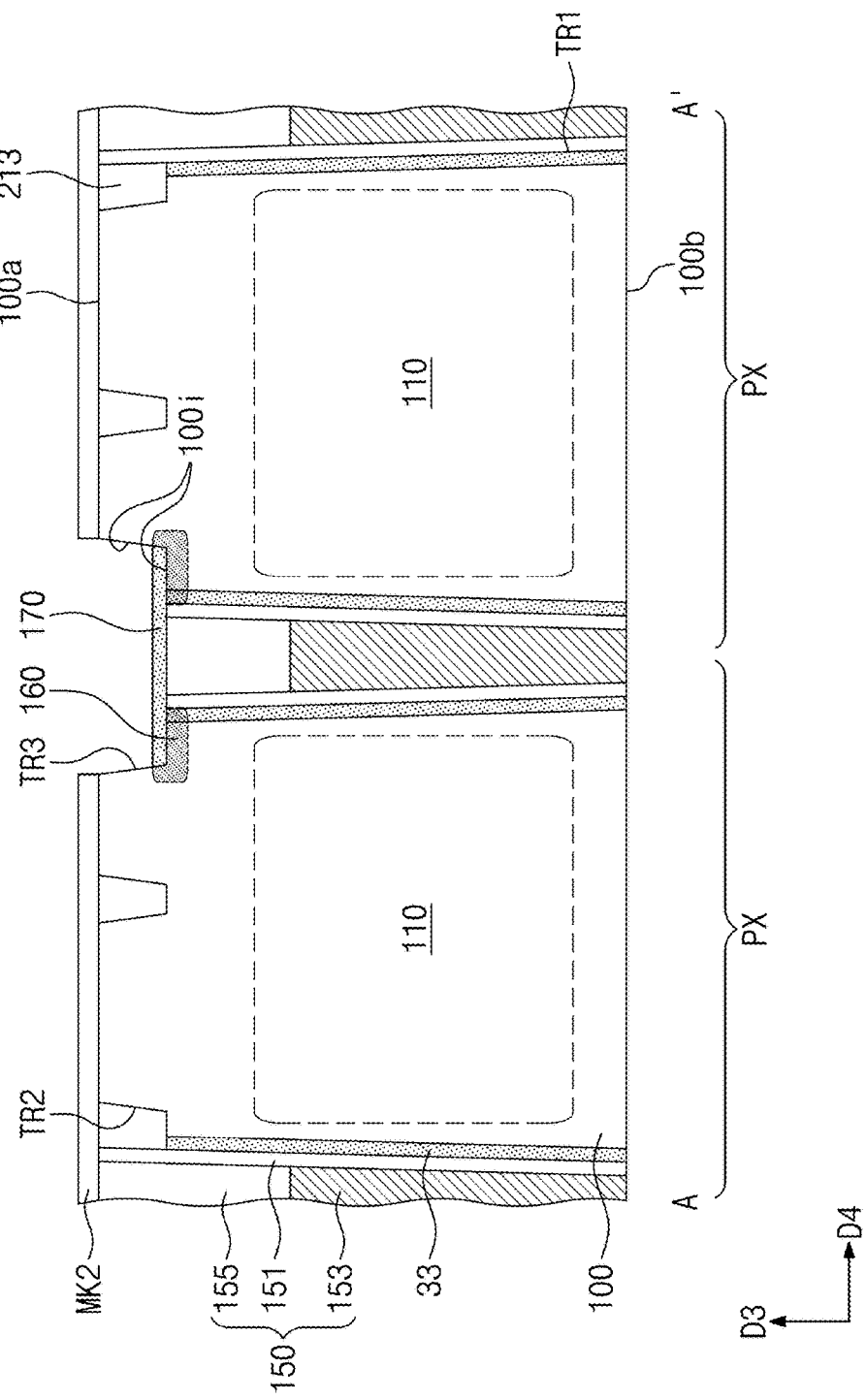

Referring to FIG. 9F, dopants may be injected into each of unit pixel regions PX to form a photoelectric conversion region 110. The photoelectric conversion regions 110 may have a second conductivity type (e.g., an n-type) different from the first conductivity type (e.g., the p-type). A thinning process for removing a portion of the first substrate 100 may be performed to reduce a vertical thickness of the first substrate 100. The thinning process may include grinding or polishing the second surface 100*b* of the first substrate 100, and anisotropically or isotropically etching the ground or polished second surface 100*b*. To thin the first substrate 100, the first substrate 100 may be turned over. A portion of the first substrate 100 may be removed by the grinding or polishing process, and then, the anisotropic or isotropic etching process may be performed to remove remaining surface defects of the first substrate 100.

The thinning process may be performed on the second surface 100*b* of the first substrate 100 to expose bottom surfaces of the first isolation pattern 151 and the second isolation pattern 153. The bottom surfaces of the first isolation pattern 151 and the second isolation pattern 153 may be located at substantially the same level as the second surface 100*b* of the first substrate 100.

A third trench TR3 may be formed in the first surface 100*a* of the first substrate 100. The formation of the third trench TR3 may include forming a second mask pattern MK2 on the first surface 100*a* of the first substrate 100, and performing an etching process on the first surface 100*a* by using the second mask pattern MK2 as an etch mask. The third trench TR3 may expose the barrier dopant region 33 provided on a sidewall of the pixel isolation pattern 150 disposed between the unit pixel regions PX.

An ion implantation process may be performed through the third trench TR3 to form a ground dopant region 160. The ground dopant region 160 may be formed along a bottom surface and a sidewall of the third trench TR3. A portion of the ground dopant region 160 may overlap with the barrier dopant region 33. The ground dopant region 160 may be spaced apart from the topmost surface of the first substrate 100. The ground dopant region 160 may be a doped region having the same conductivity type (i.e., the first conductivity type (e.g., the p-type)) as the first substrate 100.

A connection pattern 170 may be formed in the third trench TR3. For example, the connection pattern 170 may be formed using a deposition process. The connection pattern 170 may cover the bottom surface of the third trench TR3. The connection pattern 170 may be in contact with the ground dopant region 160. For example, the connection pattern 170 may include poly-silicon doped with p-type dopants (e.g., boron). For certain examples, the connection pattern 170 may include a metal material (e.g., tungsten, copper, aluminum and/or titanium) and/or a metal nitride (e.g., titanium nitride).

Figure 9G:
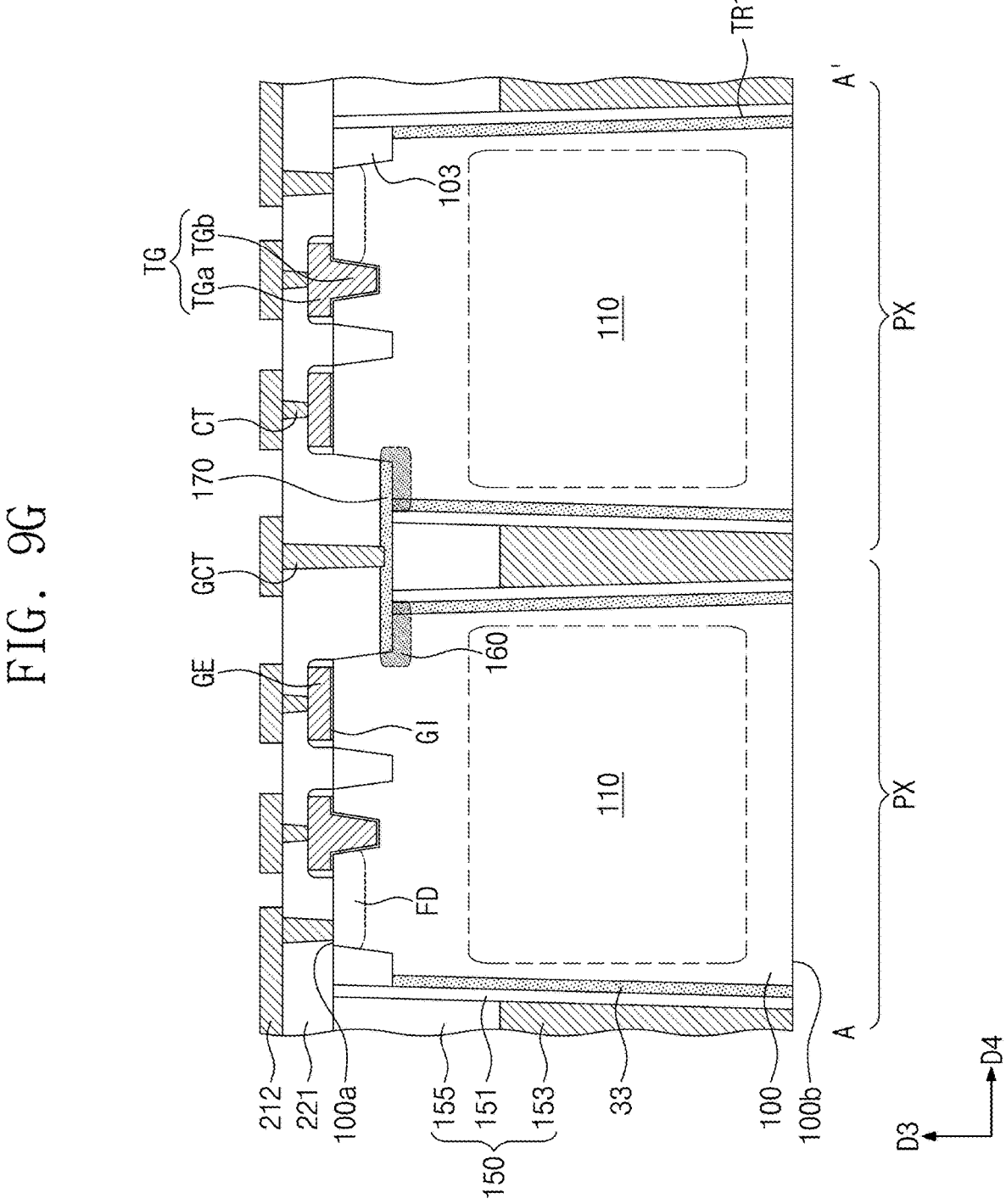

Referring to FIG. 9G, a transfer gate TG and a gate electrode GE may be formed on the first surface 100*a* of the first substrate 100. Dopants may be injected into the first substrate 100 at a side of the transfer gate TG to form a floating diffusion region FD. Even though not shown in the drawings, dopants may be injected into the first substrate 100 at both sides (e.g., opposite sides) of the gate electrode GE to form the source/drain regions SDR described with reference to FIG. 4.

A first insulating layer 221 may be formed on the first surface 100*a* of the first substrate 100. The first insulating layer 221 may cover the gate electrodes GE and the transfer gates TG. The first insulating layer 221 may fill a remaining portion of the third trench TR3. Contacts CT and a ground contact GCT may be formed to penetrate the first insulating layer 221. Each of the contacts CT may be connected to the floating diffusion region FD, the gate electrode GE, or the transfer gate TG. The ground contact GCT may be connected to the connection pattern 170. First interconnection lines 212 may be formed on the first insulating layer 221.

Referring again to FIGS. 4, 5A, 5B and 6, a second insulating layer 222 may be formed on the first insulating layer 221. The second insulating layer 222 may cover the first interconnection lines 212. Vias 215 may be formed to penetrate the second insulating layer 222. Second interconnection lines 213 may be formed on the second insulating layer 222. A third insulating layer 223 may be formed on the second insulating layer 222. The third insulating layer 223 may cover the second interconnection lines 213. The vias 215 may electrically connect the first and second interconnection lines 212 and 213 to each other.

A first fixed charge layer 132, a second fixed charge layer 134 and a planarization layer 136 may be sequentially formed on the second surface 100*b* of the first substrate 100. A light blocking pattern 315 and a low-refractive index pattern 311 may be formed on the planarization layer 136. A protective layer 316 may be formed to cover the low-refractive index pattern 311 and the light blocking pattern 315. Color filters 303 may be formed on the protective layer 316. A micro lens portion 306 may be formed on the color filters 303.

Figure 10:
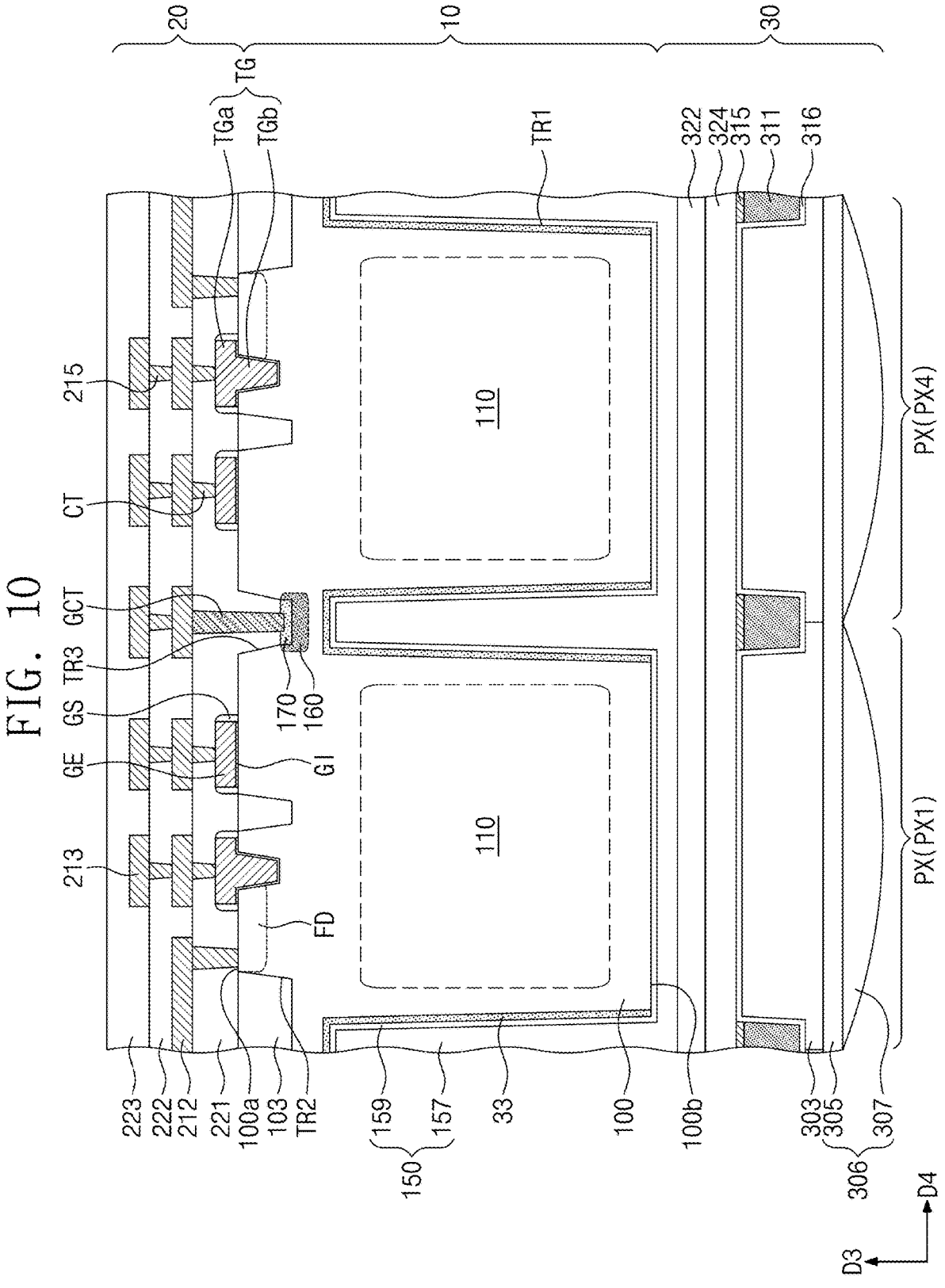
FIG. 10 is a cross-sectional view illustrating an image sensor according to some example embodiments of the inventive concepts.

FIG. 10 is a cross-sectional view illustrating an image sensor according to some example embodiments of the inventive concepts. In the description of some example embodiments, including the example embodiments shown in FIG. 10, the descriptions to the same features as mentioned with reference to FIGS. 4, 5A, 5B and 6 will be omitted and differences between the example embodiments shown in FIG. 10 and the example embodiments shown in FIGS. 4, 5A, 5B and 6 will be mainly described, for the purpose of ease and convenience in explanation.

Referring to FIG. 10, a pixel isolation pattern 150 may be provided in a first trench TR1. The first trench TR1 may be recessed from the second surface 100*b* of the first substrate 100. A width of the first trench TR1 may become progressively less from the second surface 100*b* toward the first surface 100*a* of the first substrate 100.

The pixel isolation pattern 150 may include a fixed charge layer 159 conformally provided along an inner surface of the first trench TR1, and a filling insulation pattern 157 provided on the fixed charge layer 159. The fixed charge layer 159 may have negative fixed charges. The fixed charge layer 159 may be formed of a metal oxide or metal fluoride including at least one metal selected from a group consisting of hafnium (Hf), zirconium (Zr), aluminum (Al), tantalum (Ta), titanium (Ti), yttrium (Y), and a lanthanoid. For example, the fixed charge layer 159 may be a hafnium oxide layer or an aluminum oxide layer. Holes may be accumulated in the vicinity of the fixed charge layer 159. Thus, a dark current and a white spot may be effectively reduced. The filling insulation pattern 157 may include an insulating material having an excellent step coverage property. For example, the filling insulation pattern 157 may include a silicon oxide layer. The fixed charge layer 159 may extend onto the second surface 100*b* of the first substrate 100. The filling insulation pattern 157 may also extend onto the second surface 100*b* of the first substrate 100.

A first passivation layer 322 and a second passivation layer 324 may be sequentially stacked on a bottom surface of the filling insulation pattern 157. Each of the first passivation layer 322 and the second passivation layer 324 may include an inorganic oxide. For example, each of the first passivation layer 322 and the second passivation layer 324 may include silicon oxide.

A ground dopant region 160 may be provided along a bottom surface and a sidewall of a third trench TR3. For example, a single ground dopant region 160 may be shared by the first to fourth pixel regions PX1, PX2, PX3 and PX4. The ground dopant region 160 may be spaced apart from the pixel isolation pattern 150.

Figure 11:
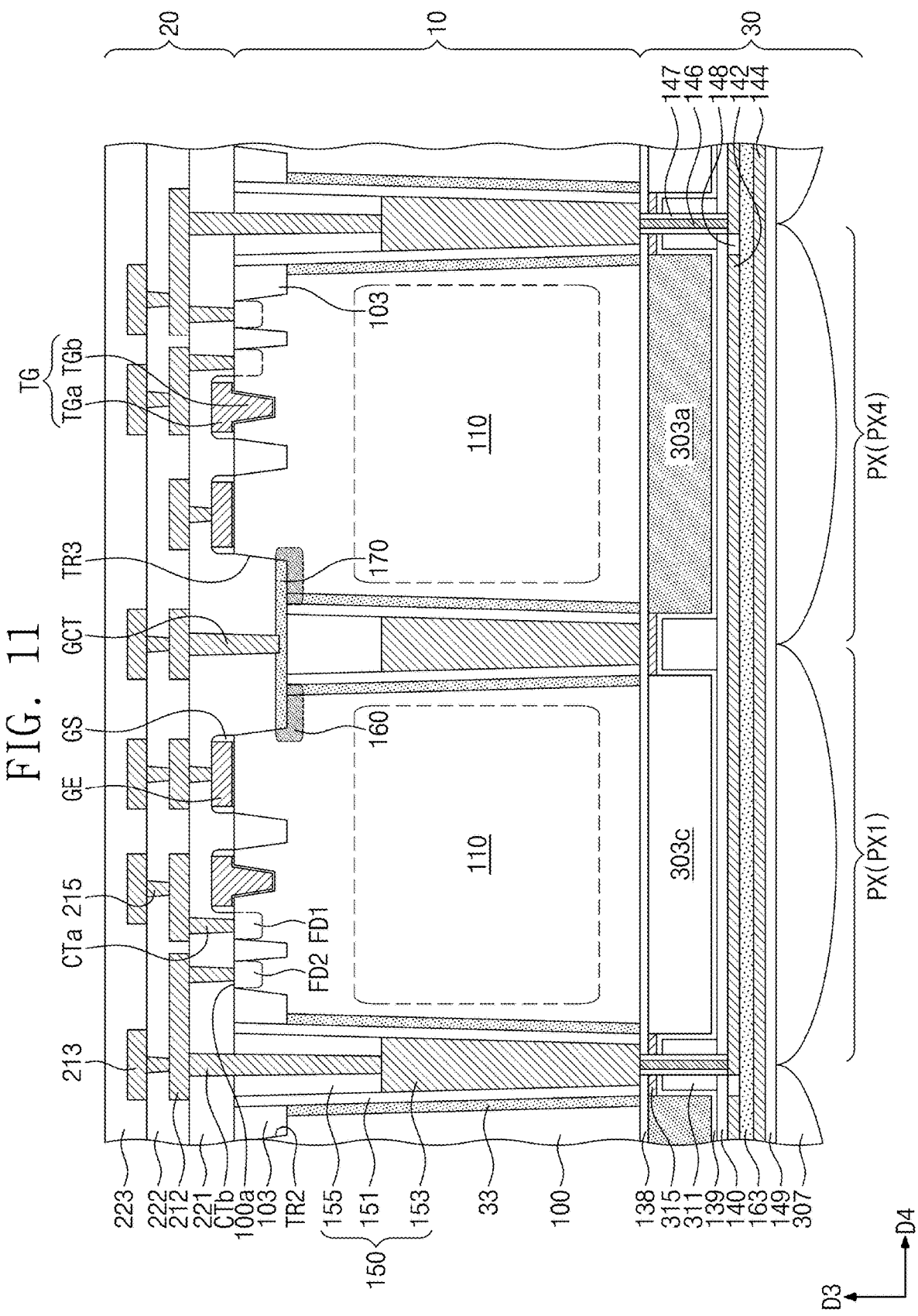
FIG. 11 is a cross-sectional view illustrating an image sensor according to some example embodiments of the inventive concepts.

FIG. 11 is a cross-sectional view illustrating an image sensor according to some example embodiments of the inventive concepts. In the description of some example embodiments, including the example embodiments shown in FIG. 11, the descriptions to the same features as mentioned with reference to FIGS. 4, 5A, 5B and 6 will be omitted and differences between the example embodiments shown in FIG. 11 and the example embodiments shown in FIGS. 4, 5A, 5B and 6 will be mainly described, for the purpose of ease and convenience in explanation.

Referring to FIG. 11, a first floating diffusion region FD1 and a second floating diffusion region FD2 may be provided in an upper portion of the first substrate 100. The second floating diffusion region FD2 may be spaced apart from the first floating diffusion region FD1 by the device isolation pattern 103.

A first insulating layer 138 may be provided on the second surface 100b of the first substrate 100. Color filters 303a and 303c may be disposed on the first insulating layer 138 to correspond to the unit pixel regions PX, respectively. The light blocking pattern 315 may be disposed on the first insulating layer 138 between the color filters 303a and 303c. A second insulating layer 139 may cover sidewalls and bottom surfaces of the color filters 303a and 303c and a bottom surface of the light blocking pattern 315. A space between the color filters 303a and 303c may be filled with the low-refractive index pattern 311.

A third insulating layer 140 may be provided on the second insulating layer 139 and the low-refractive index pattern 311. A pixel electrode 142 corresponding to each or some of the unit pixel regions PX may be provided on the third insulating layer 140. An insulating pattern 148 may be disposed between the pixel electrodes 142. For example, the insulating pattern 148 may include silicon oxide or silicon nitride. A photoelectric conversion pattern 163 may be provided on the pixel electrodes 142. A common electrode 144 may be provided on the photoelectric conversion pattern 163. A passivation layer 149 may be provided on the common electrode 144. The micro lenses 307 may be provided on the passivation layer 149.

The pixel electrode 142 and the common electrode 144 may include indium tin oxide (ITO), indium zinc oxide (IZO), zinc oxide (ZnO), and/or an organic transparent conductive material. For example, the photoelectric conversion pattern 163 may be an organic photoelectric conversion layer. The photoelectric conversion pattern 163 may include a p-type organic semiconductor material and an n-type organic semiconductor material, and the p-type organic semiconductor material and the n-type organic semiconductor material may form a p-n junction. In some example embodiments, the photoelectric conversion pattern 163 may include quantum dots or a chalcogenide.

The pixel electrode 142 may be electrically connected to the pixel isolation pattern 150 through a via plug 146. More particularly, the pixel electrode 142 may be electrically connected to the second isolation pattern 153 of the pixel isolation pattern 150. The via plug 146 may penetrate the third insulating layer 140, the low-refractive index pattern 311, the second insulating layer 139, the light blocking pattern 315 and the first insulating layer 138 and may be in contact with the pixel isolation pattern 150. A sidewall of the via plug 146 may be covered with a via insulating layer 147. The pixel isolation pattern 150 may be electrically connected to the second floating diffusion region FD2 through a first interconnection line 212 and contacts CTa and CTb. First contacts CTa may be connected to the transfer gate TG, the gate electrode GE and first and second floating diffusion regions FD1 and FD2. A second contact CTb may be connected to the second isolation pattern 153. A bottom surface of the second contact CTb may be located at a lower level than bottom surfaces of the first contacts CTa.

Figure 12:
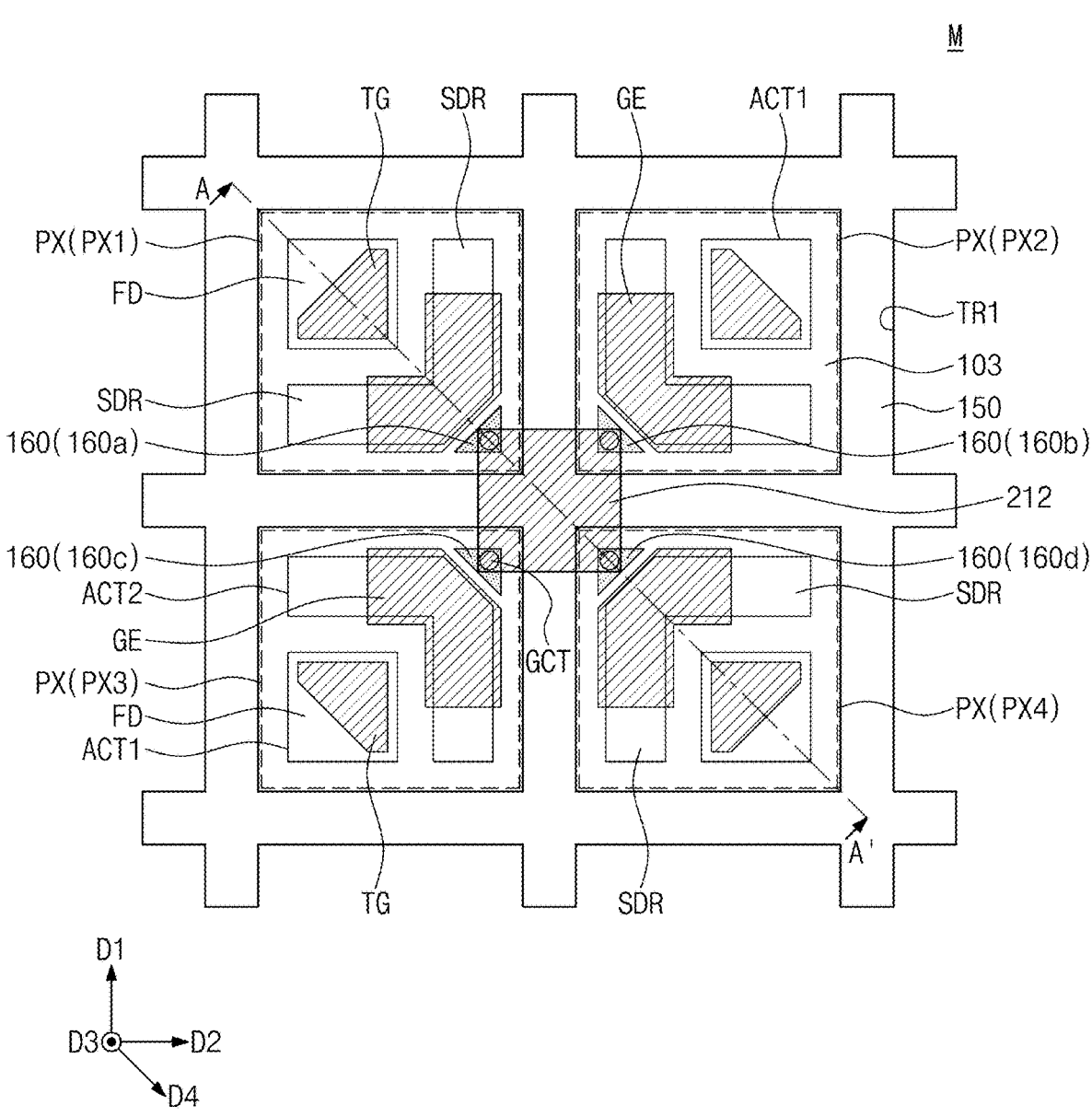
FIG. 12 is an enlarged plan view of the region 'M' of FIG. 2 to illustrate an image sensor according to some example embodiments of the inventive concepts.
Figure 13:
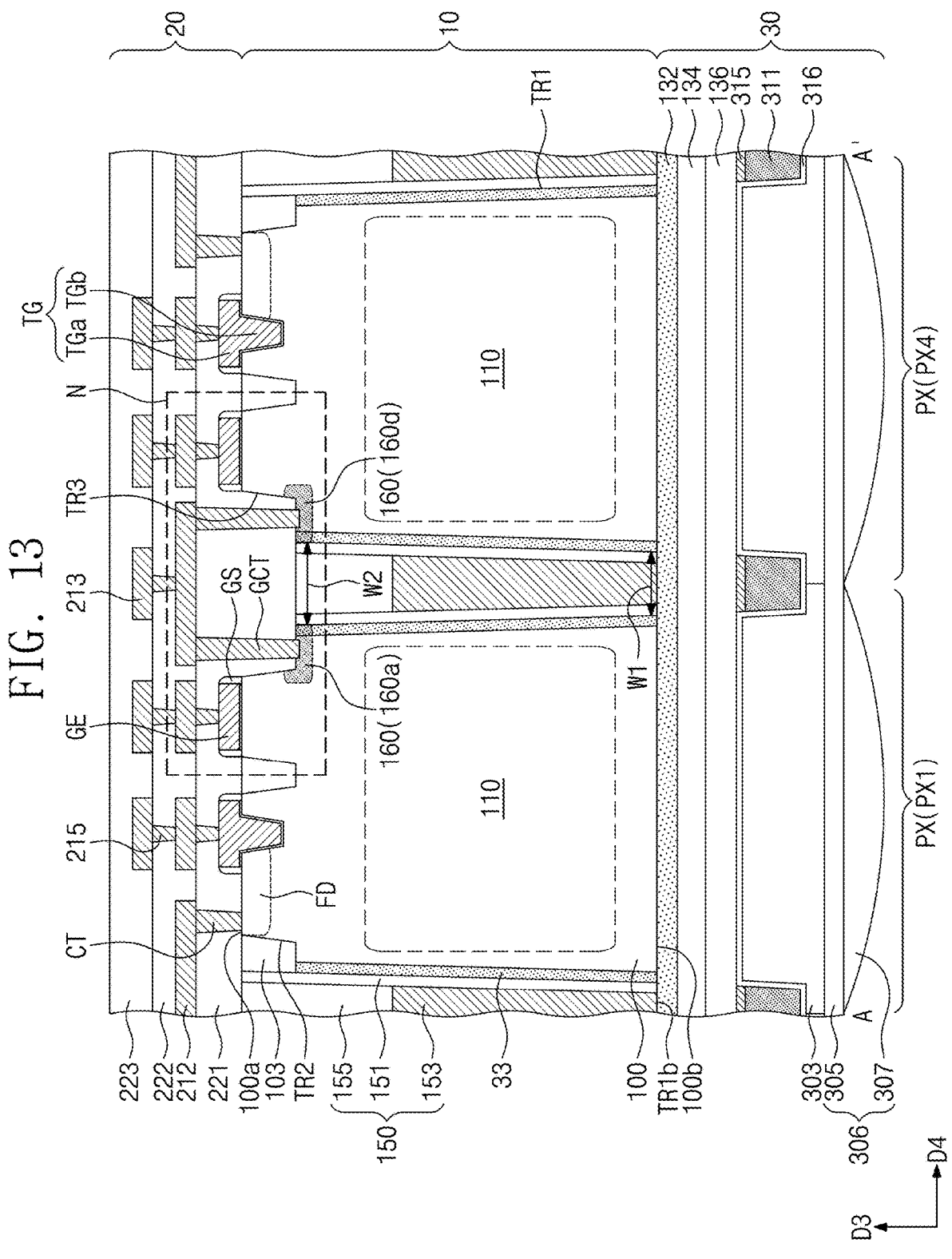
FIG. 13 is a cross-sectional view taken along a line A-A' of FIG. 12.
Figure 14:
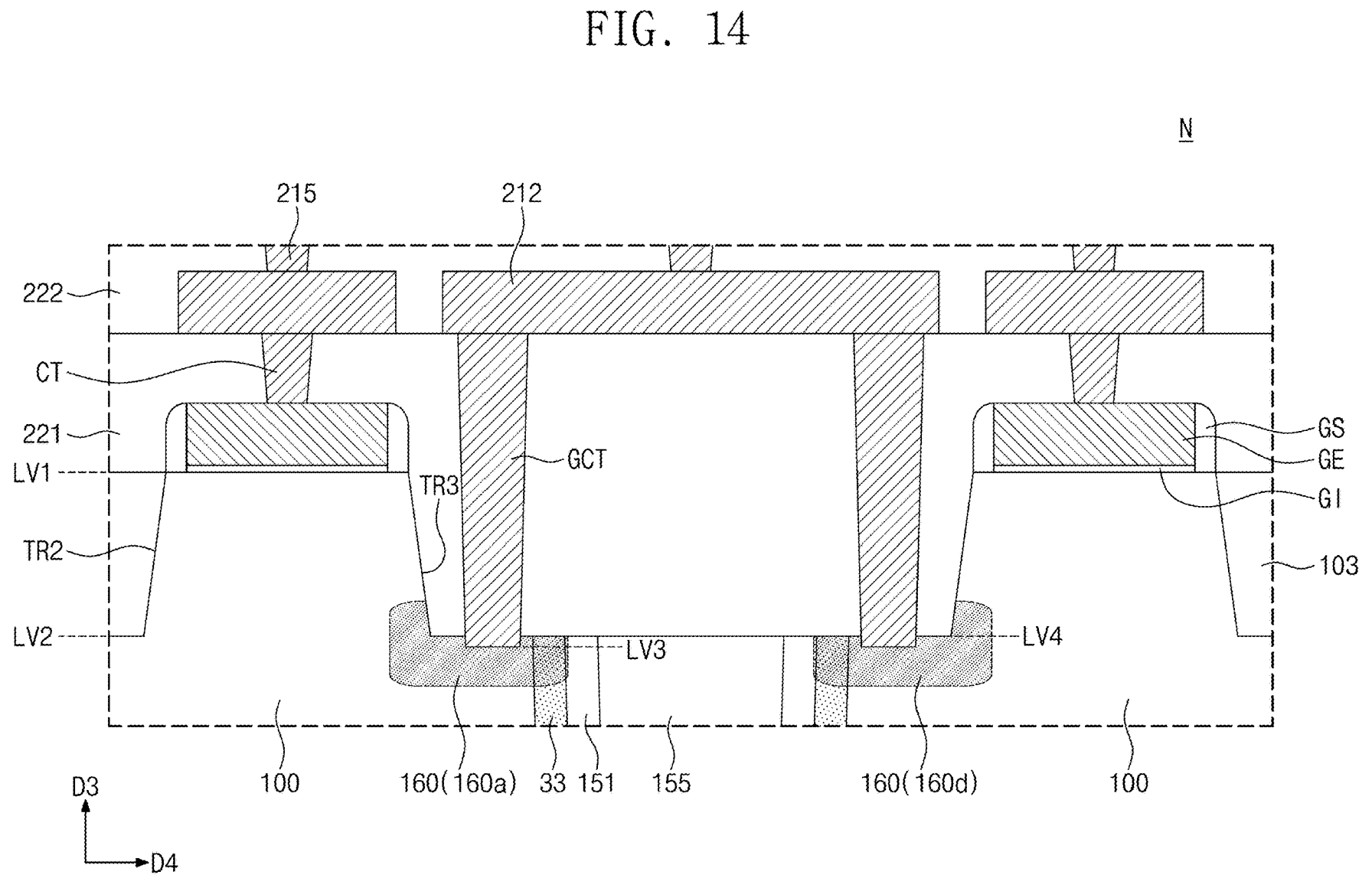

FIG. 12 is an enlarged plan view of the region 'M' of FIG. 2 to illustrate an image sensor according to some example embodiments of the inventive concepts. FIG. 13 is a cross-sectional view taken along a line A-A' of FIG. 12. FIG. 14 is an enlarged cross-sectional view of a region 'N' of FIG. 13. In the description of some example embodiments, including the example embodiments shown in FIG. 12, the descriptions to the same features as mentioned with reference to FIGS. 4, 5A, 5B and 6 will be omitted and differences between the example embodiments shown in FIG. 12 and the example embodiments shown in FIGS. 4, 5A, 5B and 6 will be mainly described, for the purpose of ease and convenience in explanation.

Referring to FIGS. 12 to 14, ground contacts GCT may be in contact with the first to fourth ground dopant regions 160a, 160b, 160c and 160d, respectively. The ground contact GCT may be directly connected to the ground dopant region 160. The ground contact GCT may vertically overlap with at least one of the first to fourth ground dopant regions 160a, 160b, 160c and 160d. At least one of the ground contacts GCT may be disposed on each of the unit pixel regions PX. The ground contacts GCT on the first to fourth pixel regions PX1, PX2, PX3 and PX4 may be electrically connected to each other through a corresponding one of the first interconnection lines 212. The corresponding first interconnection line 212 may intersect the pixel isolation pattern 150 between the first to fourth pixel regions PX1, PX2, PX3 and PX4.

A bottom surface of the ground contact GCT may be located at a third level LV3. A bottom surface of the third trench TR3 may be located at a fourth level LV4. For example, the third level LV3 may be lower than the fourth level LV4. In this case, the bottom surface and a portion of a sidewall of the ground contact GCT may be in contact with the ground dopant region 160. In some example embodiments, the third level LV3 may be substantially the same as the fourth level LV4. In other words, the bottom surface of the ground contact GCT may be in contact with a top surface of the ground dopant region 160.

According to some example embodiments, including the example embodiments shown in FIG. 12, a single first interconnection line 212 may be provided to connect all of the ground contacts GCT connected to the first to fourth ground dopant regions 160a, 160b, 160c and 160d, respectively. Thus, it is possible to reduce or minimize a parasitic capacitance which may occur between the first interconnection lines 212 adjacent to each other. As a result, electrical characteristics of the image sensor may be improved.

According to some example embodiments of the inventive concepts, the ground dopant region may be formed along the bottom surface and the sidewall of the third trench exposing the pixel isolation pattern. Thus, the area occupied by the ground dopant region in the unit pixel region may be greatly reduced. Therefore, the degree of freedom of the design of the image sensor may be increased, and it is possible to increase the size of the second active pattern in which the gate electrode and the source/drain region are formed. As a result, electrical failure (e.g., a short channel effect) and noise of the image sensor may be reduced.

In addition, according some example embodiments of the inventive concepts, including the example embodiments shown in at least FIGS. 4, 5A, 5B, and 6, the connection pattern may be provided to connect the first to fourth ground dopant regions disposed adjacent to the third trench. Thus, it is possible to reduce the number of the ground contact and the number and the length of the first interconnection line connected to the ground contact. In other words, it is possible to reduce parasitic capacitances between the first interconnection lines adjacent to each other and between the ground contacts adjacent to each other. As a result, electrical characteristics of the image sensor may be improved.

Furthermore, widths and sizes of the active patterns may be relatively increased to effectively reduce failure or defects occurring in processes of manufacturing the image sensor. As a result, reliability of the image sensor may be improved.

While some example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate including a first pixel region and a second pixel region which are adjacent to each other, the substrate including a first surface and a second surface which are opposite to each other;
a pixel isolation pattern in the substrate, the pixel isolation pattern defining the first and second pixel regions;
a transfer gate on the first surface of the substrate in the first pixel region;
a floating diffusion region adjacent to a side of the transfer gate;
a first ground dopant region adjacent to the first surface of the substrate in the first pixel region;
a second ground dopant region adjacent to the first surface of the substrate in the second pixel region;
a trench that vertically overlaps with a portion of the first pixel region and a portion of the second pixel region;
a connection pattern covering a bottom surface of the trench; and
a ground contact connected to the connection pattern,
wherein a bottom surface of the first ground dopant region is located at a lower level than a bottom surface of the floating diffusion region,
wherein the substrate includes one or more inner surfaces that at least partially define the trench exposing the pixel isolation pattern, and
wherein the connection pattern includes poly-silicon.

2. The image sensor of claim 1, wherein
each of the first ground dopant region and the second ground dopant region is in contact with the bottom surface and a sidewall of the trench.

3. The image sensor of claim 2, further comprising:
a contact connected to the floating diffusion region,
wherein a bottom surface of the ground contact is located at a lower level than a bottom surface of the contact.

4. The image sensor of claim 3, wherein the ground contact vertically overlaps with the pixel isolation pattern.

5. The image sensor of claim 1, further comprising:
a barrier dopant region on a sidewall of the pixel isolation pattern,
wherein a portion of the first ground dopant region overlaps with the barrier dopant region.

6. The image sensor of claim 1, wherein a width of the pixel isolation pattern becomes progressively less from the second surface of the substrate toward the first surface of the substrate.

7. The image sensor of claim 1, wherein
the substrate includes or more inner surfaces that at least partially define a trench exposing the pixel isolation pattern;
a first ground contact connected to the first ground dopant region;
a second ground contact connected to the second ground dopant region; and
an interconnection line connecting the first ground contact and the second ground contact, wherein the interconnection line intersects the pixel isolation pattern between the first pixel region and the second pixel region.

8. The image sensor of claim 7, wherein the first ground contact vertically overlaps with the first ground dopant region.

9. The image sensor of claim 7, wherein a bottom surface of the first ground contact is located at a lower level than a bottom surface of the trench.

10. An image sensor, comprising:
a substrate including a plurality of unit pixel regions and having a first surface and a second surface which are opposite to each other, the plurality of unit pixel regions including separate, respective photoelectric conversion regions in the substrate;
a pixel isolation pattern penetrating the substrate to define the plurality of unit pixel regions, wherein the substrate includes more inner surfaces that at least partially define a trench exposing the pixel isolation pattern;
a transfer gate on the first surface of the substrate;
a floating diffusion region adjacent to a side of the transfer gate, the floating diffusion region adjacent to the first surface of the substrate;
a ground dopant region adjacent to the trench;
a connection pattern in the trench, the connection pattern being in contact with the ground dopant region;
a contact connected to the floating diffusion region; and
a ground contact connected to the ground dopant region,
wherein a bottom surface of the ground contact is located at a lower level than a bottom surface of the contact, and
wherein the connection pattern includes poly-silicon.

11. The image sensor of claim 10, wherein a bottom surface of the ground dopant region is located at a lower level than a bottom surface of the floating diffusion region.

12. The image sensor of claim 10, further comprising:
color filters on the second surface of the substrate; and
a micro lens portion disposed on the color filters.

13. The image sensor of claim 10, wherein the ground dopant region is adjacent to the pixel isolation pattern.

14. The image sensor of claim 10, further comprising:
an insulating layer covering the transfer gate,
wherein the insulating layer fills a remaining portion of the trench, and
wherein the ground dopant region is in contact with a bottom surface and a sidewall of the trench.

15. An image sensor, comprising:
a substrate having a first surface and a second surface which are opposite to each other, the substrate including a pixel array region, an optical black region and a pad region, and the pixel array region including a first pixel region, a second pixel region, a third pixel region and a fourth pixel region, the first to fourth pixel regions having separate, respective photoelectric conversion regions;
a pixel isolation pattern in the substrate, the pixel isolation pattern defining the first to fourth pixel regions, the pixel isolation pattern comprising a first isolation pattern and a second isolation pattern that is between the first isolation pattern and the substrate, wherein the substrate includes or more inner surfaces that at least partially define a trench exposing the pixel isolation pattern, the trench vertically overlapping with a portion of each of the first to fourth pixel regions;
a barrier dopant region on a sidewall of the pixel isolation pattern;

a device isolation pattern which is in each of the first to fourth pixel regions and is adjacent to the first surface of the substrate;

a transfer gate and a gate electrode which are on each of the first to fourth pixel regions and are on the first surface of the substrate;

a floating diffusion region adjacent to a side of the transfer gate;

source/drain regions at opposite sides of the gate electrode;

a first ground dopant region, a second ground dopant region, a third ground dopant region and a fourth ground dopant region which are adjacent to the first surface of the substrate, the first to fourth ground dopant regions in separate, respective pixel regions of the first to fourth pixel regions;

an insulating layer covering the gate electrode and the transfer gate;

an interconnection line in the insulating layer;

a contact penetrating the insulating layer and electrically connected to the transfer gate, the gate electrode, or the floating diffusion region;

a ground contact penetrating the insulating layer and electrically connected to at least one of the first to fourth ground dopant regions;

color filters on the second surface of the substrate; and a micro lens portion on the color filters, wherein each of the first to fourth ground dopant regions is in contact with a bottom surface and a sidewall of the trench.

16. The image sensor of claim 15, further comprising:

a connection pattern covering the bottom surface of the trench, wherein the ground contact is in contact with the connection pattern.

17. The image sensor of claim 15, wherein a bottom surface of the ground contact is located at a lower level than a bottom surface of the contact.

18. The image sensor of claim 15, wherein the ground contact vertically overlaps with the pixel isolation pattern.

19. The image sensor of claim 15, wherein the ground contact vertically overlaps with the first ground dopant region.

* * * * *